United States Patent
Lin et al.

(10) Patent No.: US 12,302,588 B2
(45) Date of Patent: May 13, 2025

(54) MEMORY DEVICE

(71) Applicant: TAIWAN SEMICONDUCTOR MANUFACTURING COMPANY, LTD., Hsinchu (TW)

(72) Inventors: Meng-Han Lin, Hsinchu (TW); Chia-En Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 397 days.

(21) Appl. No.: 17/690,650

(22) Filed: Mar. 9, 2022

(65) Prior Publication Data

US 2023/0292531 A1 Sep. 14, 2023

(51) Int. Cl.
| H01L 21/00 | (2006.01) |
| H10B 53/20 | (2023.01) |
| H10B 61/00 | (2023.01) |
| H10B 63/00 | (2023.01) |

(52) U.S. Cl.
CPC ............. *H10B 63/34* (2023.02); *H10B 53/20* (2023.02); *H10B 61/22* (2023.02)

(58) Field of Classification Search
CPC ......... H10B 63/34; H10B 53/20; H10B 61/22
See application file for complete search history.

(56) References Cited

U.S. PATENT DOCUMENTS

| 11,495,618 | B2 * | 11/2022 | Lin | H10B 43/20 |
| 11,569,264 | B2 * | 1/2023 | Wang | H10B 41/20 |
| 11,574,929 | B2 * | 2/2023 | Wang | H10B 43/20 |
| 11,805,652 | B2 * | 10/2023 | Wang | H10B 41/20 |
| 11,839,080 | B2 * | 12/2023 | Lu | H01L 23/5221 |
| 11,963,363 | B2 * | 4/2024 | Chia | G11C 11/2257 |
| 2021/0375917 | A1 * | 12/2021 | Lu | H10B 41/10 |
| 2021/0375919 | A1 * | 12/2021 | Wang | H01L 23/5226 |
| 2021/0375932 | A1 * | 12/2021 | Wang | H10B 51/10 |
| 2021/0375938 | A1 * | 12/2021 | Lin | H10B 51/30 |
| 2021/0399050 | A1 * | 12/2021 | Lin | G11C 13/0069 |
| 2022/0020774 | A1 * | 1/2022 | Chia | H10B 51/10 |
| 2022/0028893 | A1 * | 1/2022 | Lin | G11C 8/14 |
| 2022/0037361 | A1 * | 2/2022 | Lin | H01L 23/5226 |
| 2022/0093685 | A1 * | 3/2022 | Kamata | H10B 63/84 |

(Continued)

FOREIGN PATENT DOCUMENTS

| CN | 115867038 A | * | 3/2023 | .......... H01L 27/1159 |
| EP | 3940778 A1 | * | 1/2022 | .......... G11C 11/2255 |

(Continued)

*Primary Examiner* — Laura M Menz
(74) *Attorney, Agent, or Firm* — Birch, Stewart, Kolasch & Birch, LLP

(57) ABSTRACT

A memory device includes two word-line electrodes, two source-line electrodes, and two data storage features for use by four memory cells, which are referred to as first, second, third and fourth memory cells. One word-line electrode is common to the first and second memory cells, and the other word-line electrode is common to the third and fourth memory cells. One source-line electrode is common to the first and second memory cells, and the other source-line electrode is common to the third and fourth memory cells. One data storage feature is common to the first and third memory cells, and the other data storage feature is common to the second and fourth memory cells.

7 Claims, 19 Drawing Sheets

(56) References Cited

U.S. PATENT DOCUMENTS

| | | | | |
|---|---|---|---|---|
| 2022/0102427 A1* | 3/2022 | Kim | ........................ | H10B 61/22 |
| 2022/0352256 A1* | 11/2022 | Su | ........................... | H10N 50/80 |
| 2022/0367517 A1* | 11/2022 | Lin | ................... | H01L 29/66787 |
| 2022/0392919 A1* | 12/2022 | Wang | ..................... | H10B 51/10 |
| 2022/0399400 A1* | 12/2022 | Takashima | .............. | H10B 63/10 |
| 2023/0024339 A1* | 1/2023 | Cheng | ..................... | H10B 51/10 |
| 2023/0076806 A1* | 3/2023 | Lin | ........................ | H10B 51/20 |
| 2023/0122757 A1* | 4/2023 | Wang | ..................... | H10B 43/20 |
| 2023/0232625 A1* | 7/2023 | Lin | ........................ | H10B 43/27 |
| | | | | 257/314 |
| 2023/0292531 A1* | 9/2023 | Lin | ....................... | H10B 63/845 |
| 2023/0337436 A1* | 10/2023 | Lin | ........................ | H10B 51/10 |
| 2023/0371257 A1* | 11/2023 | Lu | ........................ | H01L 23/5221 |
| 2023/0371258 A1* | 11/2023 | Sun | ........................ | H10B 41/10 |
| 2023/0389283 A1* | 11/2023 | Lin | ........................ | H10B 61/22 |
| 2024/0064984 A1* | 2/2024 | Wang | ..................... | H10B 43/20 |
| 2024/0099027 A1* | 3/2024 | Takahashi | .............. | H10B 63/34 |
| 2024/0135992 A1* | 4/2024 | Hsu | ........................ | H10B 41/27 |
| 2024/0138154 A1* | 4/2024 | Hsu | ........................ | H10B 63/30 |
| 2024/0172454 A1* | 5/2024 | Frougier | ................ | H10B 63/34 |
| 2024/0233821 A9* | 7/2024 | Hsu | ........................ | H10B 61/22 |
| 2024/0233822 A9* | 7/2024 | Hsu | ...................... | H10B 12/482 |

FOREIGN PATENT DOCUMENTS

| | | | | |
|---|---|---|---|---|
| WO | WO-2024086678 A2 * | 4/2024 | ......... | G11C 16/0483 |
| WO | WO-2024086679 A2 * | 4/2024 | ......... | G11C 16/0483 |

* cited by examiner

MEMORY DEVICE

BACKGROUND

Semiconductor memory devices are widely used in integrated circuits (ICs) to store digital data for electronic applications. A conventional design of a memory cell includes a transistor and a data storage component connected to the transistor. The data storage component may be, for example, a capacitor, a ferroelectric tunnel junction (FTJ) device, a magnetoresistive random access memory (MRAM) device, a resistive random access memory (RRAM) device, a phase-change memory (PCM) device, or the like. A bit of data can be written into the data storage component when the transistor conducts, and the bit of data can be kept in the data storage component when the transistor is turned off.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
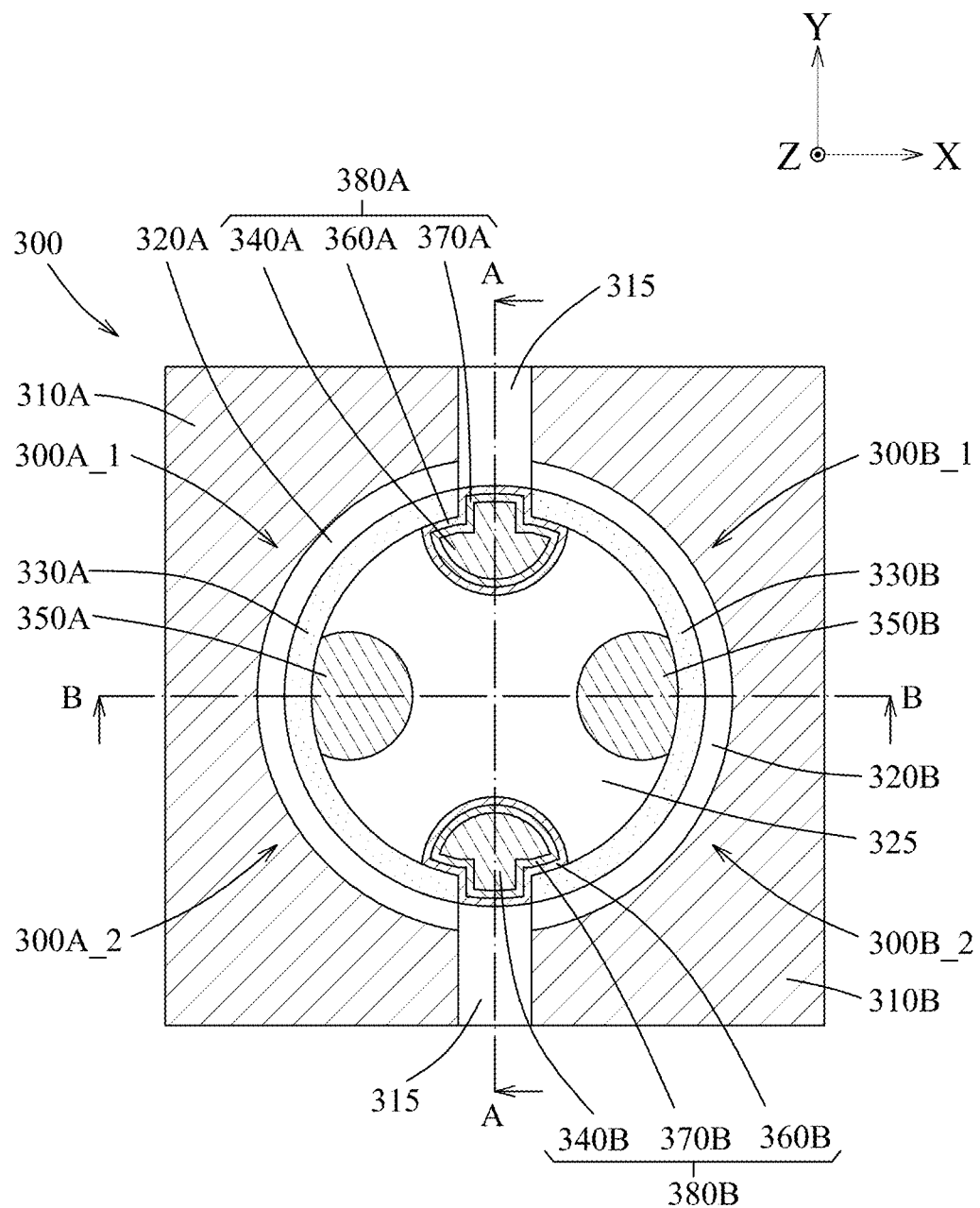
FIG. 1 is a schematic view illustrating a top view of a memory device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
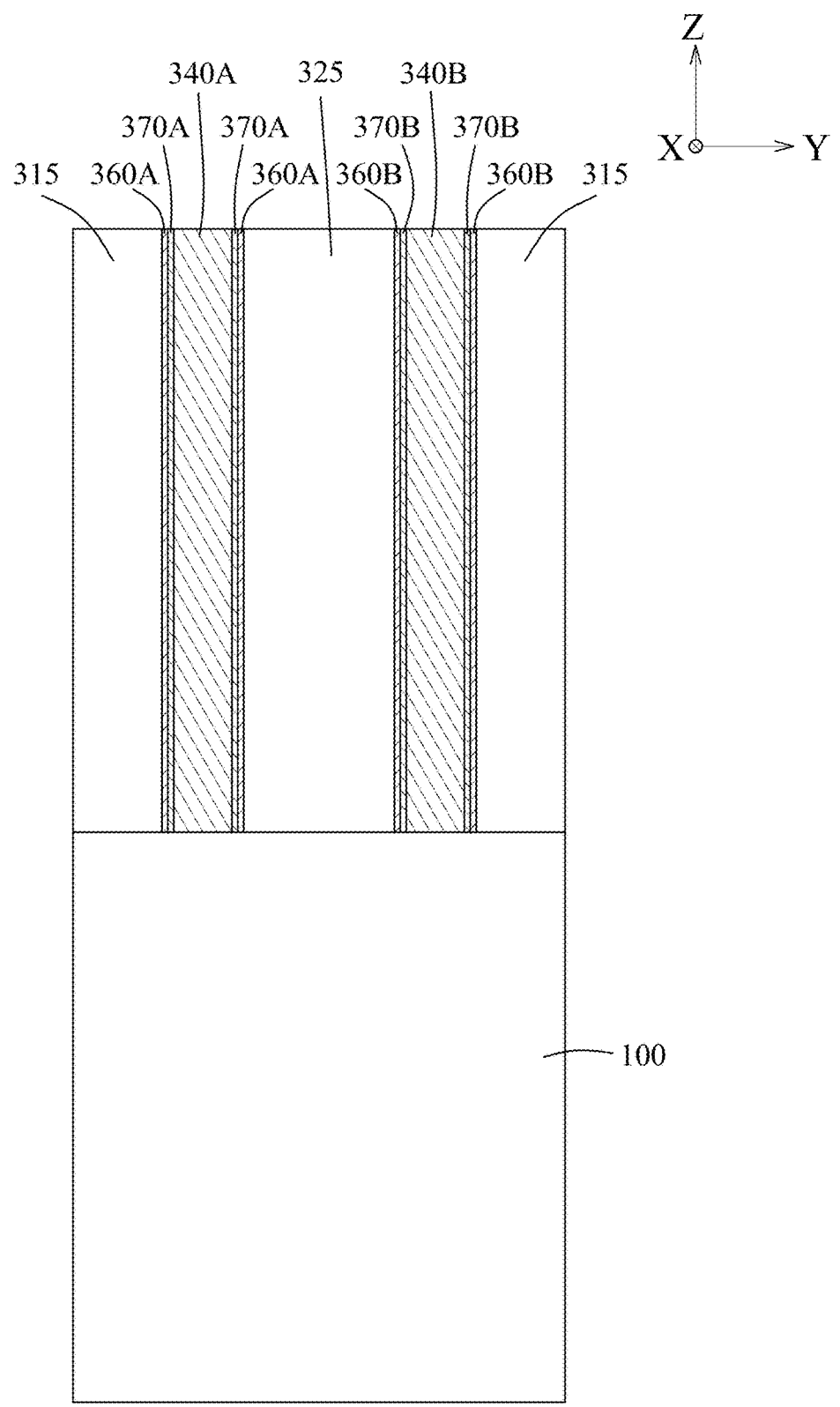
FIG. 2 is a sectional view of the memory device taken along line A-A in FIG. 1 in accordance with some embodiments.
Figure 3:
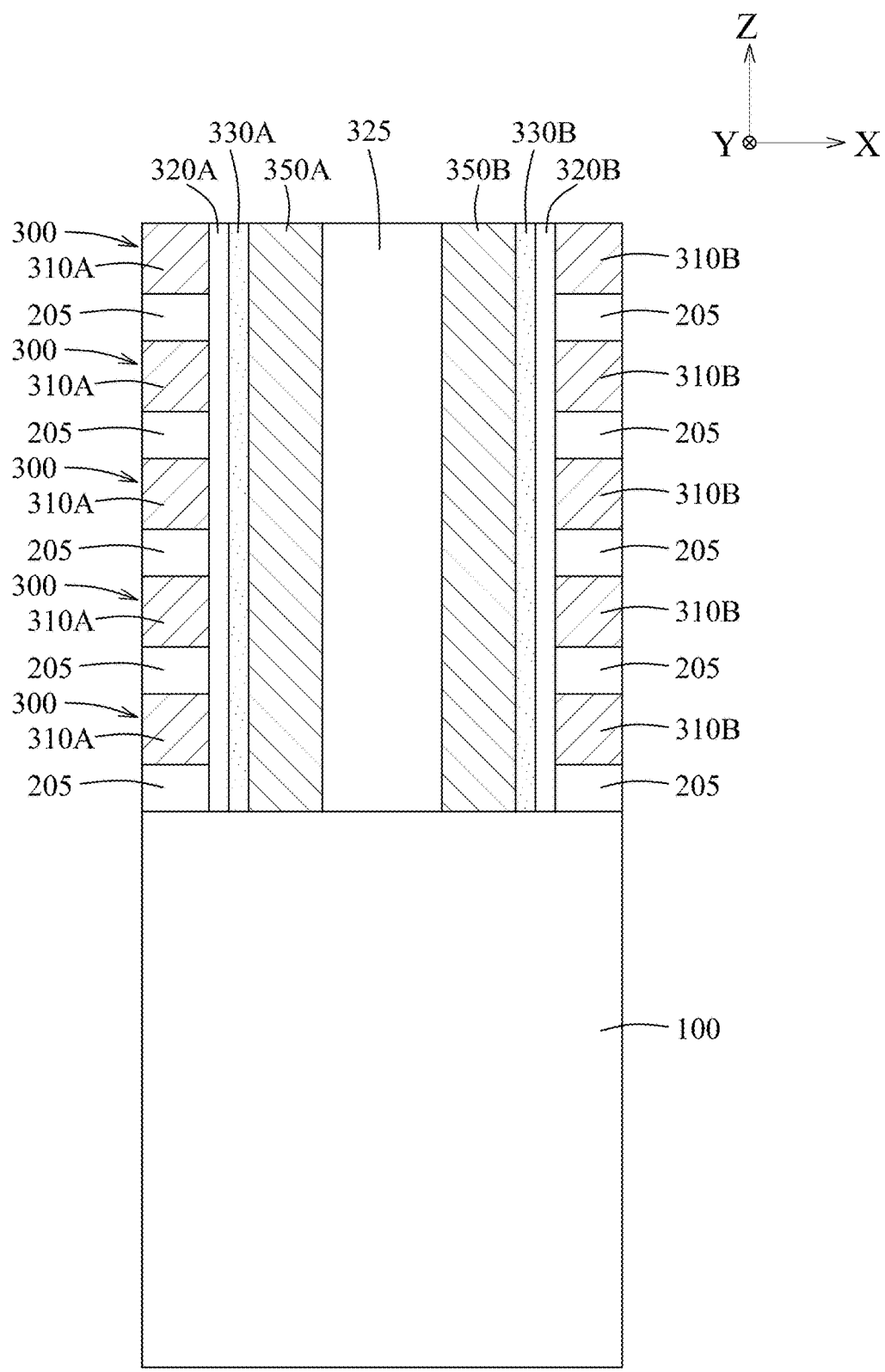
FIG. 3 is a sectional view of the memory device taken along line B-B in FIG. 1 in accordance with some embodiments.

FIG. 1 illustrates a top view of a memory device 300 in accordance with some embodiments. The memory device 300 is adapted for use in a three-dimensional (3D) memory structure, as shown in FIGS. 2 and 3, which illustrate sectional views taken along line A-A and line B-B in FIG. 1, respectively. The 3D memory structure is formed on a substrate 100, and includes multiple memory devices 300 that are disposed in different layers and aligned with each other in a Z-axis direction.

The substrate 100 may be a bulk semiconductor substrate or a semiconductor-on-insulator (SOI) substrate, which may be doped (e.g., with a p-type or an n-type dopant) or undoped. In some embodiments, an SOI substrate includes a layer of a semiconductor material formed on an insulator layer. The insulator layer may be a buried oxide (BOX) layer, a silicon oxide layer or any other suitable layer. The insulator layer may be provided on a suitable substrate, such as silicon, glass or the like. The substrate 100 may be made of a suitable semiconductor material, such as silicon or the like. In some embodiments, the substrate 100 is a silicon wafer; and in other embodiments, the substrate 100 is made of a compound semiconductor such as silicon carbide, gallium arsenide, indium arsenide, indium phosphide or other suitable materials. In still other embodiments, the substrate 100 is made of an alloy semiconductor such as GaAsP, AlInAs, AlGaAs, GaInAs, GaInP, GaInAsP or other suitable materials.

In some embodiments, the substrate 100 includes various p-type doped regions and/or n-type doped regions, such as p-type wells, n-type wells, p-type source/drain features and/or n-type source/drain features, formed by a suitable process such as ion implantation, thermal diffusion, a combination thereof, or the like. In some embodiments, the substrate 100 may include other functional elements such as resistors, capacitors, diodes, transistors, and/or the like. The transistors are, for example, field effect transistors (FETs), such as planar FETs and/or 3D FETs (e.g., fin field effect transistors (FinFETs)). The substrate 100 may include lateral isolation features (e.g., shallow trench isolation (STI)) configured to separate various functional elements formed on and/or in the substrate 100. For example, the substrate 100 may include transistors that constitute driver circuits for the memory devices 300 of the 3D memory structure.

The memory device 300 includes a first word-line electrode 310A, a first gate dielectric 320A, a first channel feature 330A, a first bit-line electrode 340A, a first source-line electrode 350A, a first metal electrode layer 360A, a first data storage layer 370A, a second word-line electrode 310B, a second gate dielectric 320B, a second channel feature 330B, a second bit-line electrode 340B, a second source-line electrode 350B, a second metal electrode layer 360B, and a second data storage layer 370B.

The first word-line electrode 310A and the second word-line electrode 310B are spaced apart from each other in an X-axis direction that is perpendicular to the Z-axis direction, and are isolated from each other by word-line isolation features 315. The first word-line electrode 310A and the second word-line electrode 310B may include, for example, Al, Ti, Ta, Au, Pt, W, Ni, Ir, TiN, TaN, IrO$_2$, n+ poly-Si, p+ poly-Si, other suitable materials, or any combination thereof. The word-line electrodes 310A, 310B of the memory devices 300 in different layers are isolated by isolation layers 205, which may include, for example, $Si_xO_y$, $Si_xN_y$, $SiO_xN_y$, other suitable materials, or any combination thereof. The word-line isolation features 315 may include, for example, $Si_xO_y$, $Si_xN_y$, $SiO_xN_y$, other suitable materials, or any combination thereof.

The first gate dielectric 320A is disposed on the first word-line electrode 310A. The second gate dielectric 320B is disposed on the second word-line electrode 310B. The first gate dielectric 320A and the second gate dielectric 320B may include, for example, $SiO_2$, high-k materials such as $HfO_2$, $SiO_2$, $Al_2O_3$ and SiON, other suitable materials, or any combination thereof.

The first channel feature 330A is disposed on a surface of the first gate dielectric 320A opposite to the first word-line metal electrode 310A, and has a first end portion (e.g., a portion that is in contact with the first metal electrode layer 360A) and a second end portion (e.g., a portion that is in contact with the second metal electrode layer 360B) that are opposite to each other. The second channel feature 330B is disposed on a surface of the second gate dielectric 320B opposite to the second word-line electrode 310B, and has a first end portion (e.g., a portion that is in contact with the first metal electrode layer 360A) and a second end portion (e.g., a portion that is in contact with the second metal electrode layer 360B) that are opposite to each other. The first channel feature 330A and the second channel feature 330B may include, for example, indium-comprising material (e.g., $In_xGa_yZn_zMO$, where M may be Ti, Al, Ag, Si, Sn, or the like), indium tungsten oxide (IWO), zinc oxide, polysilicon, other suitable materials, or any combination thereof.

The first bit-line electrode 340A and the second bit-line electrode 340B extend in the Z-axis direction, and are spaced apart from each other in a Y-axis direction that is perpendicular to the X-axis direction and the Z-axis direction. The first bit-line electrode 340A and the second bit-line electrode 340B may include, for example, Al, Ti, Ta, Au, Pt, W, Ni, Ir, TiN, TaN, $IrO_2$, n+ poly-Si, p+ poly-Si, other suitable materials, or any combination thereof.

The first source-line electrode 350A is disposed on a surface of the first channel feature 330A opposite to the first gate dielectric 320A, and extends in the Z-axis direction. The second source-line electrode 350B is disposed on a surface of the second channel feature 330B opposite to the second gate dielectric 320B, and extends in the Z-axis direction. The first source-line electrode 350A and the second source-line electrode 350B may include, for example, Al, Ti, Ta, Au, Pt, W, Ni, Ir, TiN, TaN, $IrO_2$, n+ poly-Si, p+ poly-Si, other suitable materials, or any combination thereof.

Each of the first metal electrode layer 360A and the second metal electrode layer 360B is in contact with both of the first channel feature 330A and the second channel feature 330B. The first metal electrode layer 360A has a first portion (e.g., the upper left portion in FIG. 1) and a second portion (e.g., the upper right portion in FIG. 1) that are respectively in contact with the first end portions of the first channel feature 330A and the second channel feature 330B. The second metal electrode layer 360B has a first portion (e.g., the lower left portion in FIG. 1) and a second portion (e.g., the lower right portion in FIG. 1) that are respectively in contact with the second end portions of the first channel feature 330A and the second channel feature 330B.

The first data storage layer 370A surrounds the first bit-line electrode 340A, and is surrounded by the first metal electrode layer 360A. The second data storage layer 370B surrounds the second bit-line electrode 340B, and is surrounded by the second metal electrode layer 360B. In other words, the first data storage layer 370A is disposed between the first bit-line electrode 340A and the first metal electrode layer 360A, and the second data storage layer 370B is disposed between the second bit-line electrode 340B and the second metal electrode layer 360B. In such a configuration, the first data storage layer 370A has a first portion (e.g., the upper left portion in FIG. 1) and a second portion (e.g., the upper right portion in FIG. 1) that are respectively in contact with the first and second portions of the first metal electrode layer 360A, and the first bit-line electrode 340A is in contact with the first and second portions of the first data storage layer 370A; and the second data storage layer 370B has a first portion (e.g., the lower left portion in FIG. 1) and a second portion (e.g., the lower right portion in FIG. 1) that are respectively in contact with the first and second portions of the second metal electrode layer 360B, and the second bit-line electrode 340B is in contact with the first and second portions of the second data storage layer 370B.

In the illustrative embodiment, the first bit-line electrode 340A, the first data storage layer 370A and the first metal electrode layer 360A cooperatively form a first data storage feature 380A, and the second bit-line electrode 340B, the second data storage layer 370B and the second metal electrode layer 360B cooperatively form a second data storage feature 380B. The first source-line electrode 350A, the second source-line electrode 350B, the first data storage feature 380A and the second data storage feature 380B are spaced apart from each other by an isolation feature 325 that extends in the Z-axis direction. The first data storage feature 380A and the second data storage feature 380B are exemplified as ferroelectric tunnel junction (FTJ) devices herein, and each of the first data storage layer 370A and the second data storage layer 370B may be a ferroelectric layer that includes, for example, metal-oxide such as $Hf_xO_y$, $Hf_xSi_yO_z$, $Hf_xAl_yO_z$, $Hf_xGd_yO_z$, $Hf_xZr_yO_z$, $Hf_xLa_yO_z$, $Hf_xSr_yO_z$, $Hf_xY_yO_z$, STO, metal-oxynitride, other suitable materials, or any combination thereof. The FTJ devices are advantageous in having a large on/off ratio, a non-volatile property, and operating at low-energy, etc. In other embodiments, the first data storage feature 380A and the second data storage feature 380B may be other types of memory components, such as magnetic tunnel junction (MTJ) devices, magnetoresistive random access memory (MRAM) devices, resistive random access memory (RRAM) devices, phase-change memory (PCM) devices, etc., with the data storage layers 370A, 370B being replaced with corresponding materials, while this disclosure is not limited in this respect. For each of the first data storage feature 380A and the second data storage feature 380B, a property of the data storage layer 370A, 370B (e.g., ferroelectric polarization of the ferroelectric layer) may be changed by a voltage between the metal electrode layer 360A, 360B and the bit-line electrode 340A, 340B, so as to store bit data.

The abovementioned structure forms four memory cells in the memory device 300. The four memory cells include a first memory cell 300A_1, a second memory cell 300A_2, a third memory cell 300B_1 and a fourth memory cell 300B_2. The first word-line electrode 310A and the first source-line electrode 350A are common to the first memory cell 300A_1 and the second memory cell 300A_2, and the second word-line electrode 310B and the second source-line electrode 350B are common to the third memory cell 300B_1 and the fourth memory cell 300B_2. The first data storage feature 380A is common to the first memory cell 300A_1 and the third memory cell 300B_1, and the second data storage feature 380B is common to the second memory cell 300A_2 and the fourth memory cell 300B_2.

The first memory cell 300A_1 includes a transistor (referred to as first transistor hereinafter) formed by the first word-line electrode 310A, the first gate dielectric 320A, and a portion of the first channel feature 330A that extends between the first source-line electrode 350A and the first data storage feature 380A. The first transistor has a control terminal (e.g., gate terminal) formed by the first word-line electrode 310A, a first terminal (e.g., drain terminal) connected to the first data storage feature 380A (or, formed by the first metal electrode layer 360A of the first data storage feature 380A), and a second terminal (e.g., source terminal) formed by the first source-line electrode 350A. The second memory cell 300A_2 includes a transistor (referred to as second transistor hereinafter) formed by the first word-line electrode 310A, the first gate dielectric 320A, and a portion of the first channel feature 330A that extends between the first source-line electrode 350A and the second data storage feature 380B. The second transistor has a control terminal formed by the first word-line electrode 310A, a first terminal connected to the second data storage feature 380B (or, formed by the second metal electrode layer 360B of the second data storage feature 380B), and a second terminal formed by the first source-line electrode 350A. The third memory cell 300B_1 includes a transistor (referred to as third transistor hereinafter) formed by the second word-line electrode 310B, the second gate dielectric 320B, and a portion of the second channel feature 330B that extends between the second source-line electrode 350B and the first data storage feature 380A. The third transistor has a control terminal formed by the second word-line electrode 310B, a first terminal connected to the first data storage feature 380A (or, formed by the first metal electrode layer 360A of the first data storage feature 380A), and a second terminal formed by the second source-line electrode 350B. The fourth memory cell 300B_2 includes a transistor (referred to as fourth transistor hereinafter) formed by the second word-line electrode 310B, the second gate dielectric 320B, and a portion of the second channel feature 330B that extends between the second source-line electrode 350B and the second data storage feature 380B. The fourth transistor has a control terminal formed by the second word-line electrode 310B, a first terminal connected to the second data storage feature 380B (or, formed by the second metal electrode layer 360B of the second data storage feature 380B), and a second terminal formed by the second source-line electrode 350B.

In the illustrative embodiment, each of the first gate dielectric 320A and the first channel feature 330A is concave toward the second gate dielectric 320B and the second channel feature 330B (meaning that the space in the concave structure opens toward the second gate dielectric 320B and the second channel feature 330B), and each of the second gate dielectric 320B and the second channel feature 330B is concave toward the first gate dielectric 320A and the first channel feature 320B. The first channel feature 330A is disposed on a surface of the first gate dielectric 320A that faces toward the second gate dielectric 320B and the second channel feature 330B, and the second channel feature 330B is disposed on a surface of the second gate dielectric 320B that faces toward the first gate dielectric 320A and the first channel feature 330A. The first end portions of the first channel feature 330A and the second channel feature 330B are aligned with each other in the X-axis direction, and the second end portions of the first channel feature 330A and the second channel feature 330B are aligned with each other in the X-axis direction. In the illustrative embodiment, the first gate dielectric 320A and the second gate dielectric 320B are symmetric with respect to a first imaginary line (e.g., line A-A in FIG. 1) extending in the Y-axis direction, and the first channel feature 330A and the second channel feature 330B are symmetric with respect to the first imaginary line, but this disclosure is not limited in this respect. By virtue of such configuration, the first gate dielectric 320A, the first channel feature 330A, the second gate dielectric 320B and the second channel feature 330B cooperatively form a pattern on an X-Y plane perpendicular to the Z-axis direction, and the first source-line electrode 350A, the second source-line electrode 350B, the first data storage feature 380A and the second data storage feature 380B are formed within the pattern. In such configuration, chip area can be efficiently used, so as to achieve a high memory density. In the illustrative embodiment, the pattern formed by the first gate dielectric 320A, the first channel feature 330A, the second gate dielectric 320B and the second channel feature 330B is approximate to a circle, but this disclosure is not limited in this respect. In some embodiments, the pattern formed by the first gate dielectric 320A, the first channel feature 330A, the second gate dielectric 320B and the second channel feature 330B may be of other shapes, such as being a rectangle (see FIGS. 18 and 19)

In the illustrative embodiment, the first source-line electrode 350A and the second source-line electrode 350B are located on a second imaginary line (e.g., the line B-B in FIG. 1, which extends in the X-axis direction) at symmetric positions with respect to the first imaginary line; and the first data storage feature 380A and the second data storage feature 380B are located on the first imaginary line at symmetric positions with respect to the second imaginary line. By virtue of symmetry, the memory cells 300A_1, 300A_2, 300B_1 and 300B_2 may have high uniformity in cell properties.

Figure 4:
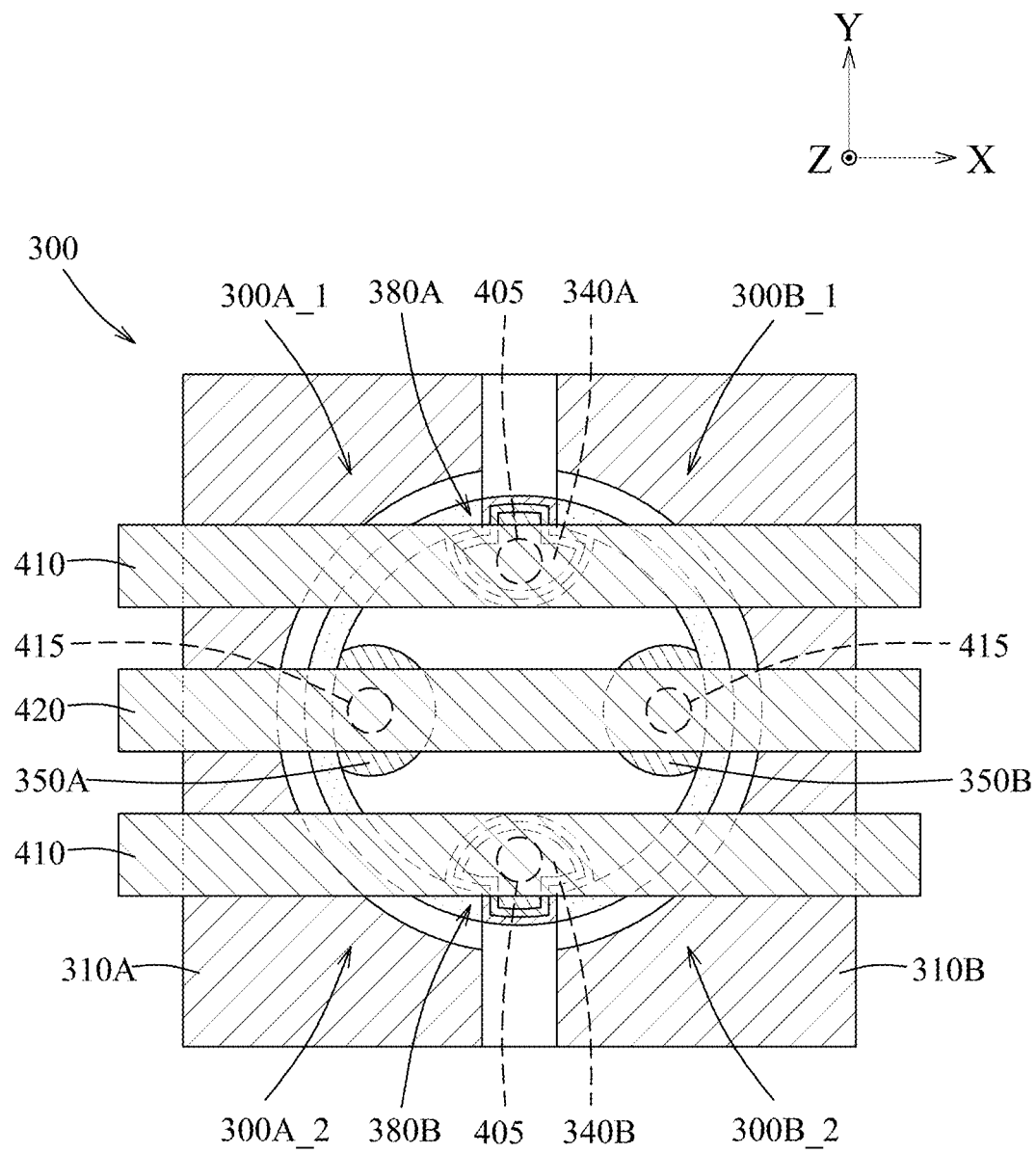
FIG. 4 is a schematic view illustrating the memory device that is connected to a source line and two bit lines in accordance with some embodiments.

Referring to FIG. 4, the bit-line electrodes 340A, 340B of the memory device 300 are respectively connected to different bit lines 410 (the one connected to the first bit-line electrode 340A being referred to as first bit line 410 hereinafter, and the one connected to the second bit-line electrode 340B being referred to as second bit line 410 hereinafter) through bit-line vias 405, and the source-line electrodes 350A, 350B are connected to a common source line 420 through source-line vias 415, where the bit lines 410 and the source line 420 extend in the X-axis direction. The bit-line vias 405 and the source-line vias 415 may be formed in a dielectric layer (not shown) that is formed between the memory device 300 and the bit lines 410 and the source line 420, and extend in the Z-axis direction. It is noted that, because of the specific arrangement of the first source-line electrode 350A, the second source-line electrode 350B, the first data storage feature 380A and the second data storage feature 380B as illustrated in FIG. 4, where the first source-line electrode 350A and the second source-line electrode 350B are located on the second imaginary line and where the first data storage feature 380A and the second data storage feature 380B are located on the first imaginary line, the bit lines 410 and the source line 420 can be made parallel to each other and thus can be formed by the same layer, so the process steps may be reduced, resulting in less manufacturing cost. The bit lines 410, the source line 420, the bit-line vias 405 and the source-line vias 415 may include, for example, Cu, Al, Ti, Ta, Au, Pt, W, Ni, Ir, TiN, TaN, other suitable materials, or any combination thereof.

In the illustrative embodiment, the common source line 420 is to be provided with a constant reference source voltage. When the first memory cell 300A_1 is selected to perform data writing operation, the first word-line electrode 310A is applied with an ON voltage to make the first transistor conducting, the first bit line 410 is provided with a data voltage for writing data into the first portion of the first data storage layer 370A, the second word-line electrode 310B is applied with an OFF voltage to make the third transistor and the fourth transistor non-conducting, and the second bit line 410 is not provided with any data voltage. When the second memory cell 300A_2 is selected to perform data writing operation, the first word-line electrode 310A is applied with the ON voltage to make the second transistor conducting, the second bit line 410 is provided with a data voltage for writing data into the first portion of the second data storage layer 370B, the second word-line electrode 310B is applied with the OFF voltage, and the first bit line 410 is not provided with any data voltage. When the third memory cell 300B_1 is selected to perform data writing operation, the first word-line electrode 310A is applied with the OFF voltage to make the first transistor and the second transistor non-conducting, the first bit line 410 is provided with a data voltage for writing data into the second portion of the first data storage layer 370A, the second word-line electrode 310B is applied with the ON voltage to make the third transistor conducting, and the second bit line 410 is not provided with any data voltage. When the fourth memory cell 300B_2 is selected to perform data writing operation, the first word-line electrode 310A is applied with the OFF voltage, the second bit line 410 is provided with a data voltage for writing data into the second portion of the second data storage layer 370B, the second word-line electrode 310B is applied with the ON voltage to make the fourth transistor conducting, and the first bit line 410 is not provided with any data voltage.

FIGS. 5 through 17 illustrate an exemplary process for fabricating a plurality of the memory devices 300 (see FIG. 1) that are arranged in an array in accordance with some embodiments.

Figure 5:
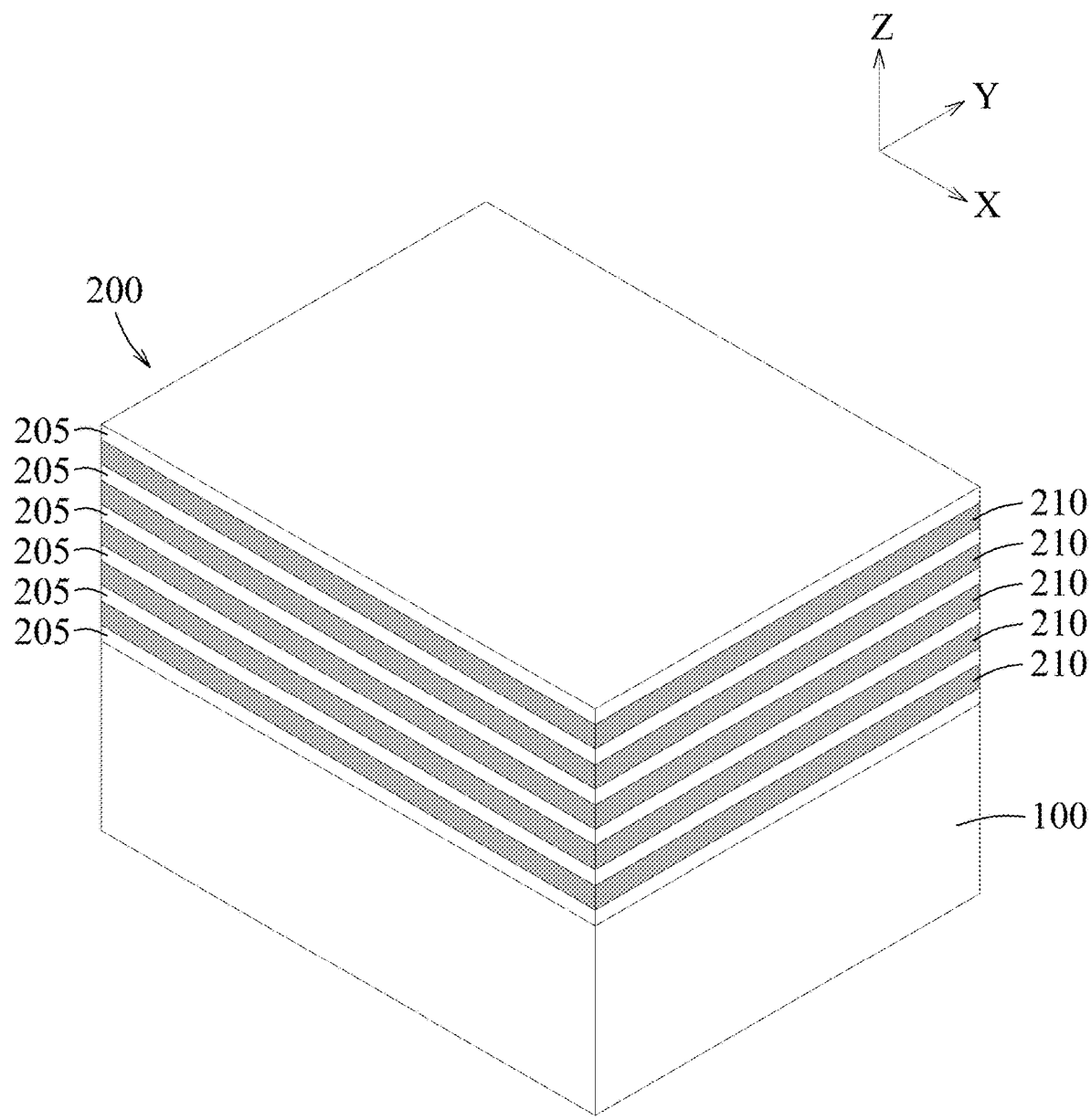
FIGS. 5 through 17 are schematic view illustrating a process for fabricating a memory device in accordance with some embodiments.

Referring to FIG. 5, multiple isolation layers 205 and multiple sacrificial layers 210 are alternately deposited to form a multilayer stack 200 on the substrate 100. Each of the isolation layers 205 may include, for example, $Si_xO_y$, $Si_xN_y$, $SiO_xN_y$, other suitable materials, or any combination thereof. Each of the sacrificial layers 210 may include, for example, $Si_xO_y$, $Si_xN_y$, $SiO_xN_y$, other suitable materials, or any combination thereof. However, the isolation layers 205 and the sacrificial layers 210 are made of different materials for etch selectivity. In the illustrative embodiment, the isolation layers 205 are made of $SiO_2$, and the sacrificial layers 210 are made of SiN, but this disclosure is not limited in this respect. The isolation layers 205 and the sacrificial layers 210 can be deposited using, for example, chemical vapor deposition (CVD), plasma-enhanced chemical vapor deposition (PECVD), physical vapor deposition (PVD), atomic layer deposition (ALD), other suitable techniques, or a combination thereof. In the illustrative embodiment, each of the isolation layers 205 and the sacrificial layers 210 may have a thickness in a range from about 20 nm to about 100 nm. An excessively small thickness (e.g., smaller than 20 nm) may result in high difficulty in manufacturing, and an excessively large thickness (e.g., greater than 100 nm) may unnecessarily increase the process time and the device dimensions.

Figure 6:
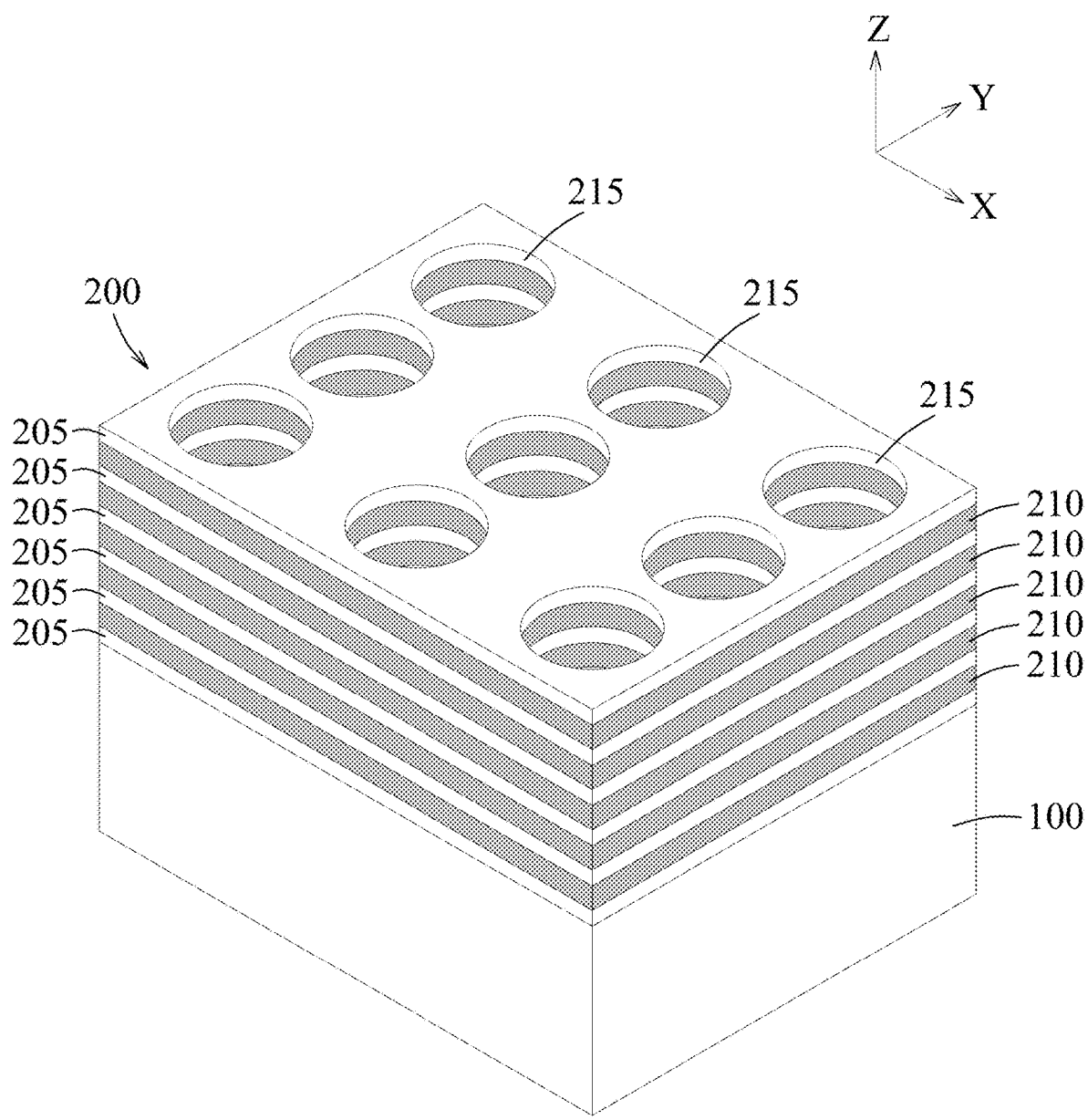

Referring to FIG. 6, the multilayer stack 200 is etched using anisotropic etching to form a plurality of channel holes 215 that extend through the multilayer stack 200 in the Z-axis direction. The etching of the isolation layers 205 and the sacrificial layers 210 may be performed using, for example, dry etching, reactive ion etching (RIE), other suitable techniques, or any combination thereof.

Figure 7:
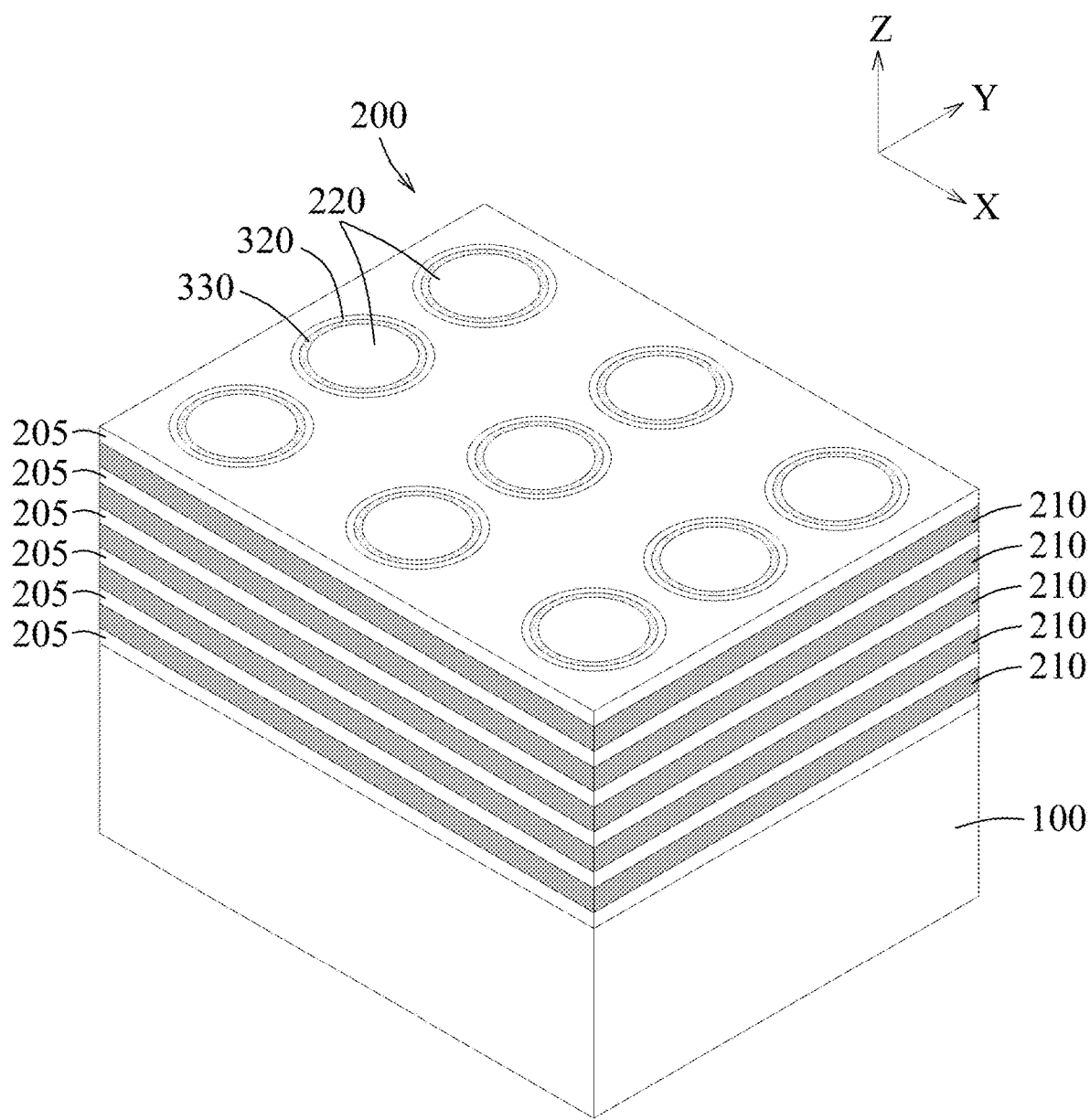

Referring to FIG. 7, a pillar feature is formed in each of the channel holes 215 of the multiplayer stack 200. The pillar feature includes an isolation pillar component 220 (which will be formed into the isolation feature 325 as illustrated in FIG. 1 at a later stage) that extends through the multilayer stack 200 in the Z-axis direction, the channel layer 330 that is disposed on and surrounds the isolation pillar component 220, and a gate dielectric layer 320 that surrounds the channel layer 330 and that is disposed between the channel layer 330 and the multilayer stack 200. The pillar feature is formed by conformally depositing the gate dielectric layer 320 on a sidewall of the channel hole 215; conformally depositing the channel layer 330 on the gate dielectric layer 320; and then depositing a channel-hole isolation layer (named after the isolation layer filled in the channel hole) to fill the channel hole 215 to form the isolation pillar component 220, followed by a chemical-mechanical planarization (CMP) process. The gate dielectric layer 320, the channel layer 330 and the isolation pillar component 220 may be formed using, for example, CVD, ALD, other suitable techniques, or a combination thereof. The isolation pillar component 220 may include the same or similar material as used in the isolation layers 205. In the illustrative embodiment, the isolation pillar component 220 is made of $SiO_2$.

Figure 18:
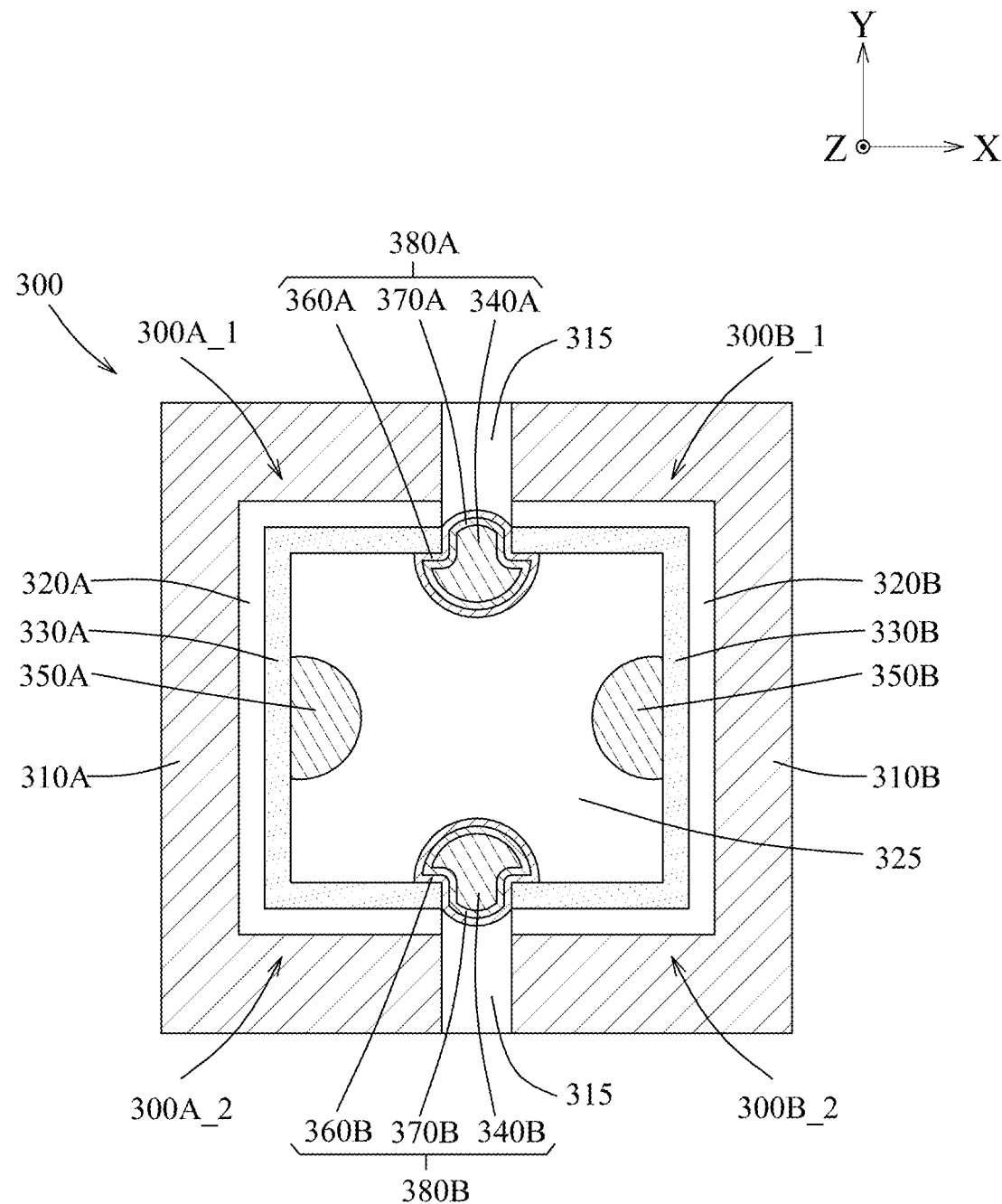
FIGS. 18 and 19 are schematic views illustrating some variations of the memory device in accordance with some embodiments.
Figure 19:
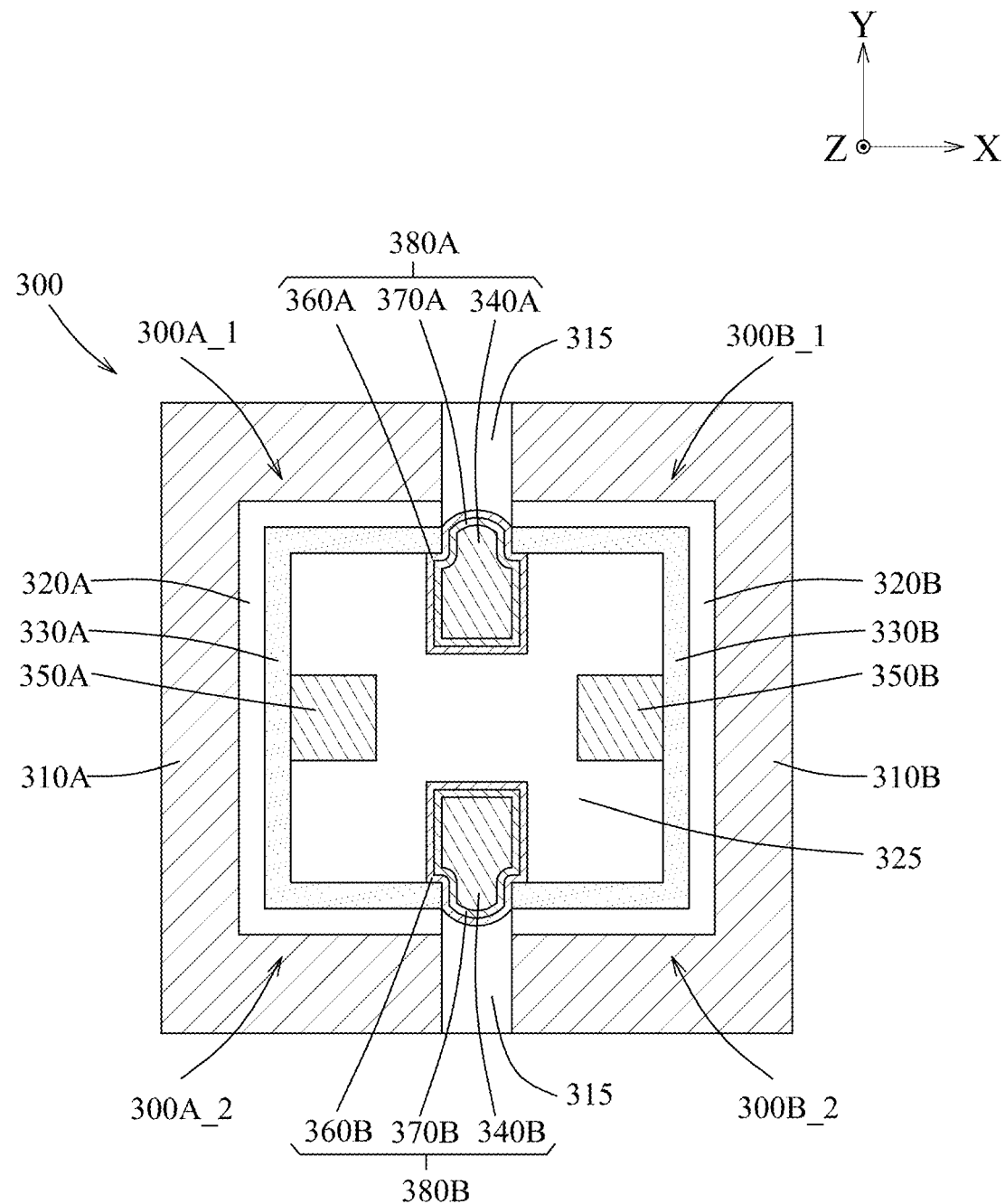

In the illustrative embodiment, the channel holes 215 have circular cross-sections (i.e., the channel holes 215 are in the shape of circular columns), formation of which is easier in comparison to other shapes, but this disclosure is not limited in this respect. The memory device 300 as illustrated in FIG. 1 is formed using a channel hole 215 with a circular cross-section, so each of the first gate dielectric 320A, the first channel feature 330A, the second gate dielectric 320B and the second channel feature 330B is an arc in shape. In some embodiments, the channel holes 215 may be etched to have other shapes, such as holes with rectangular cross-sections (including square cross-sections). FIGS. 18 and 19 illustrate two variations of the memory device 300 that are formed using channel holes with square cross-sections, so each of the first gate dielectric 320A, the first channel feature 330A, the second gate dielectric 320B and the second channel feature 330B is U-shaped with three straight segments. In comparison to the channel holes with circular cross-sections that have a diameter identical to a side length of the channel holes with square cross-sections, the transistors formed in the channel holes with square cross-sections may have a longer channel length, thereby alleviating the short-channel effect. In some embodiments, the channel holes with circular cross-sections may have a radius in a range from about 50 nm to about 250 nm. In some embodiments, the channel holes with square cross-sections may have a side length in a range from about 100 nm to about 500 nm. Excessively small channel holes (e.g., having a radius smaller than 50 nm or a side length smaller than 100 nm) may result in high difficulty in the etching process, and excessively large channel holes (e.g., having a radius greater than 250 nm or a side length greater than 500 nm) may be disadvantageous in terms of memory density.

Figure 8:
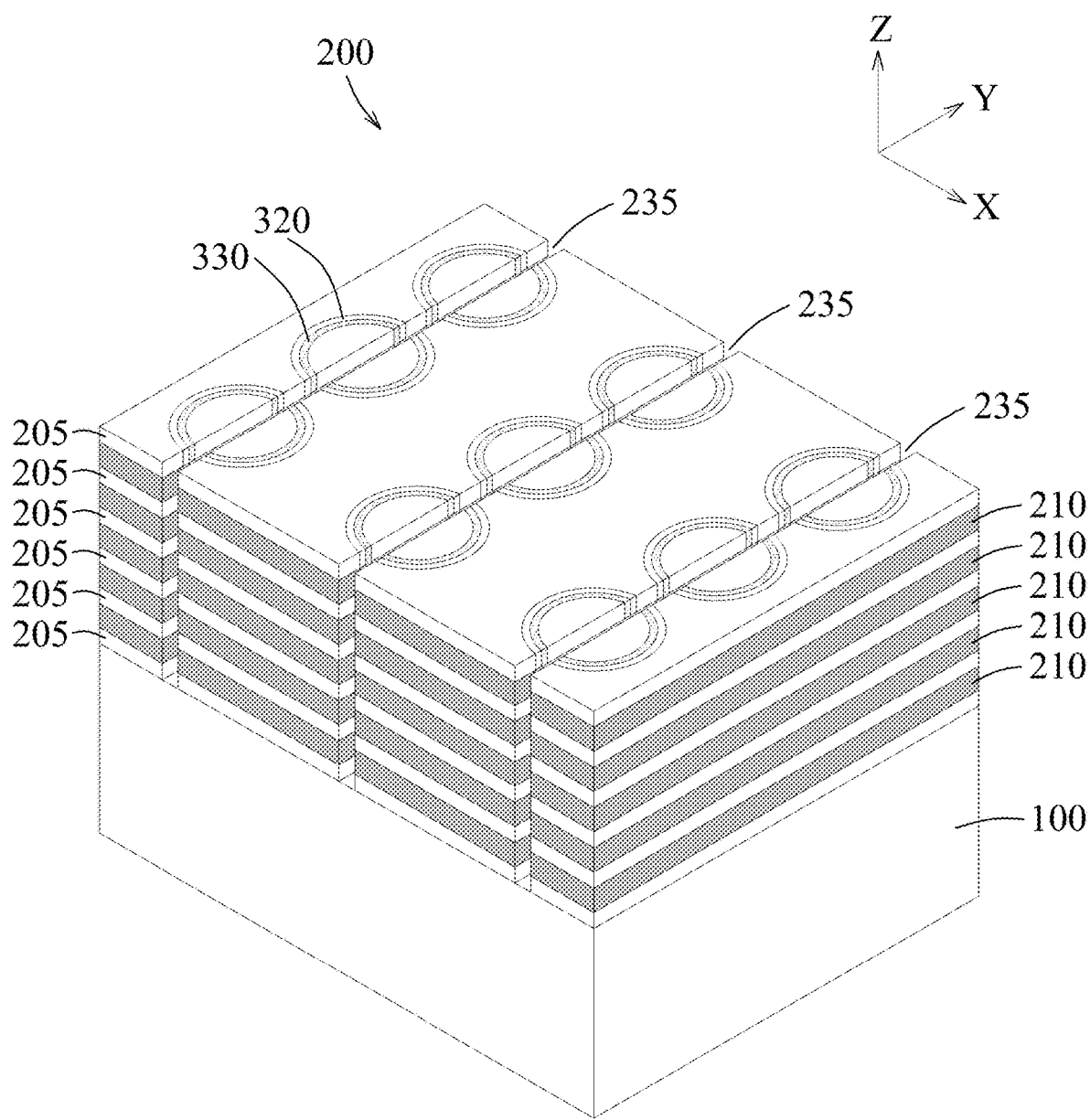

Referring to FIG. 8, with respect to each of the pillar features, a spacing trench 235 is formed to extend in the Y-axis direction and through a center of the pillar feature, and the pillar feature and a part of the multilayer stack 200 surrounding the pillar feature are thus divided into two separate portions. As a result, the gate dielectric layer 320 is divided into the first gate dielectric 320A and the second gate dielectric 320B, and the channel layer 330 is divided into the first channel feature 330A and the second channel feature 330B, as illustrated in FIG. 1. The spacing trench 235 may be formed using, for example, dry etching, RIE, other suitable techniques, or any combination thereof. In the illustrated figure, a single spacing trench 235 is formed through the center of three corresponding pillar features.

Figure 9:
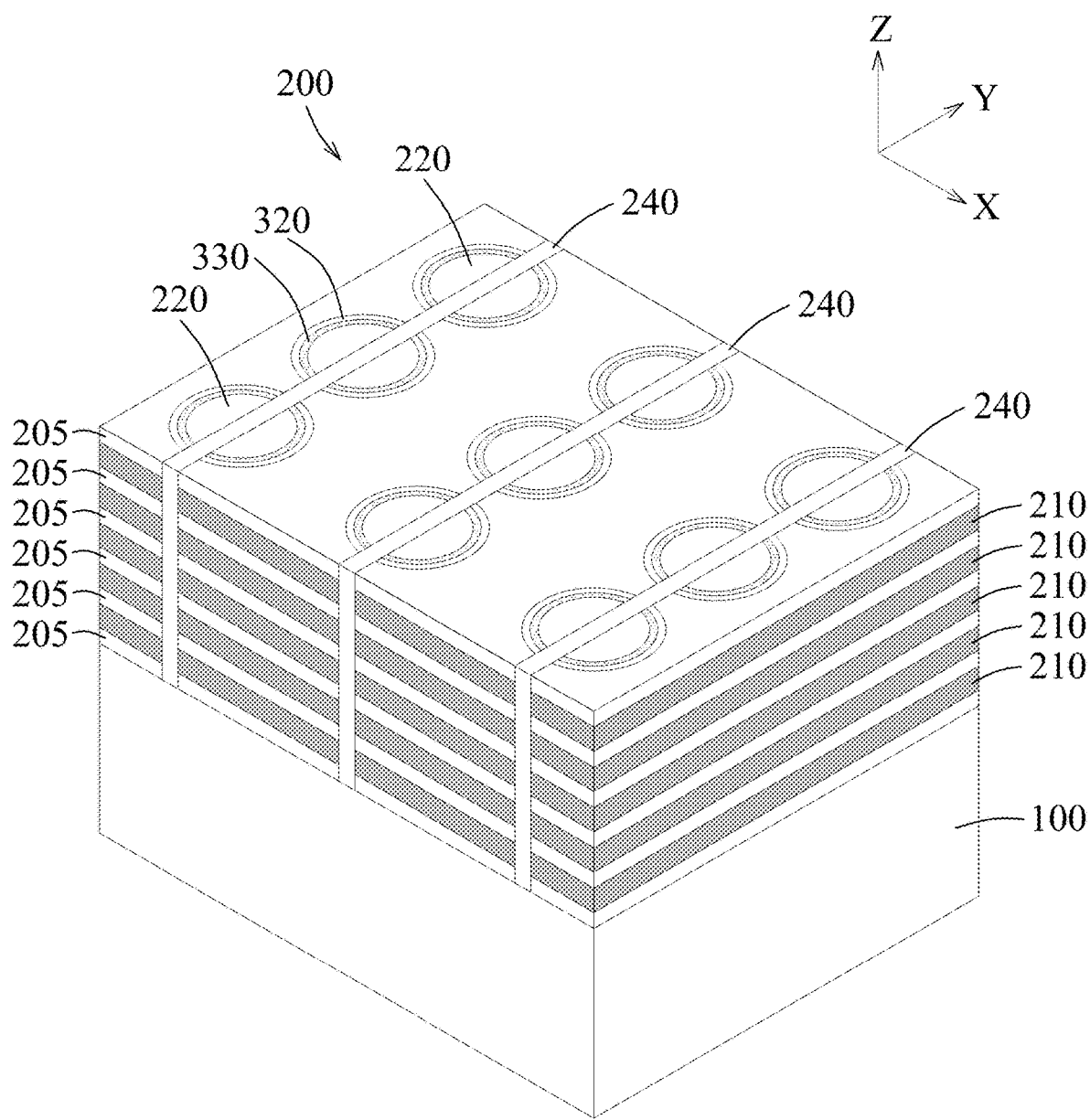

Referring to FIG. 9, a word-line isolation layer is deposited to fill the spacing trench 235, so as to form a stack-spacing isolation feature 240 that extends in the Y-axis direction, and that divides the pillar feature and the part of the multilayer stack 200. The stack-spacing isolation feature 240 may be formed using, for example, CVD, ALD, other suitable techniques, or a combination thereof, and includes the same or similar material as used in the isolation pillar component 220. In the illustrative embodiment, the stack-spacing isolation feature 240 is made of $SiO_2$, so its presence essentially makes the isolation pillar component 220 for each pillar feature whole again (i.e., reverts its state back to before the spacing trench 235 (see FIG. 8) is formed), and the stack-spacing isolation feature 240 forms the word-line isolation features 315 as illustrated in FIG. 1. In some embodiments, a CMP process may be performed after the deposition of the word-line isolation layer.

Figure 10:
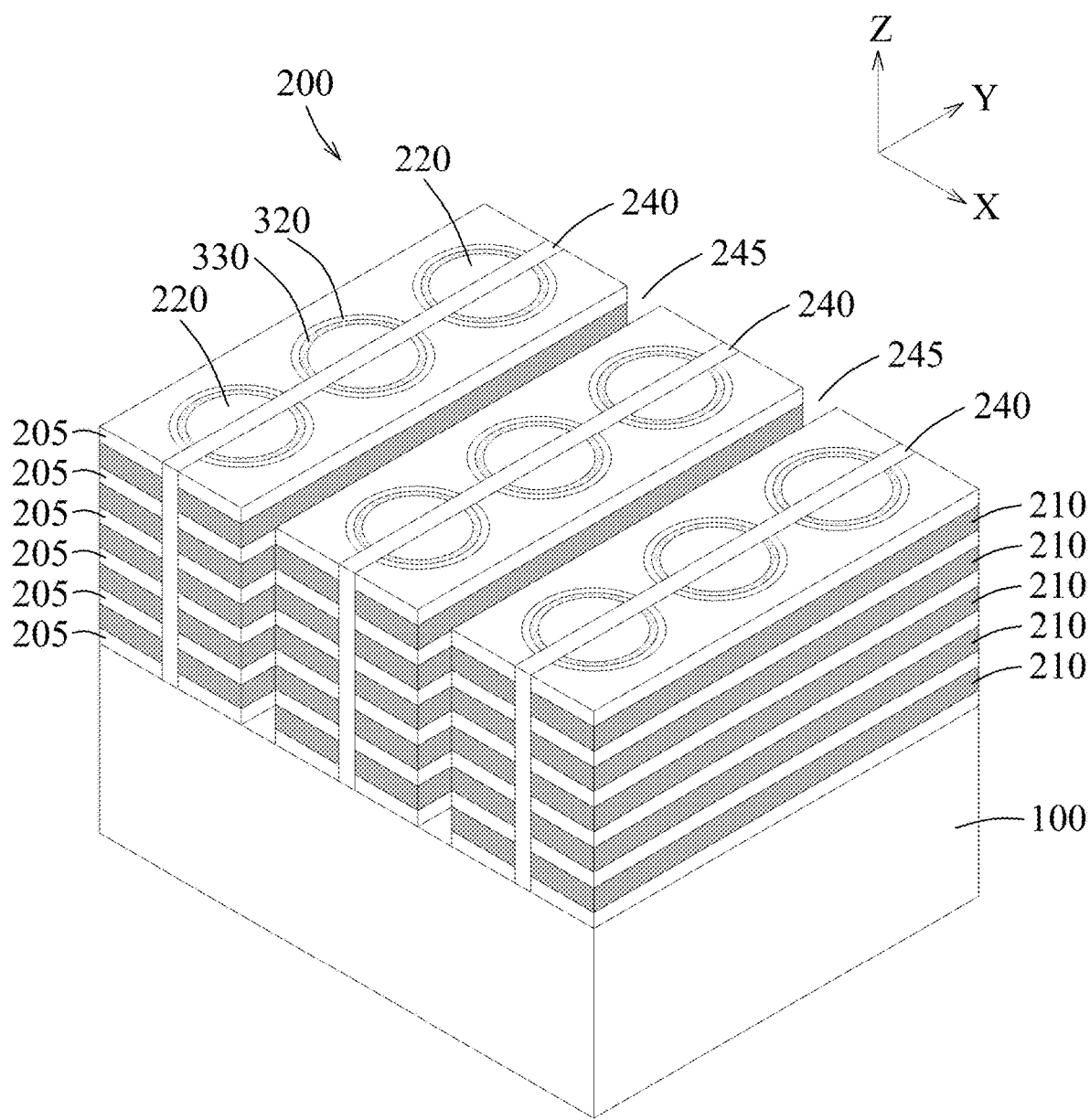

Referring to FIG. 10, the multilayer stack 200 is etched using anisotropic etching to form, with respect to each of the pillar features, a replacement trench 245 (a trench for a subsequent replacement process) that is adjacent to the pillar feature in the X-axis direction and that extends in the Y-axis direction to isolate adjacent columns of the pillar features from each other. The replacement trenches 245 may be formed using, for example, dry etching, reactive ion etching (RIE), other suitable techniques, or any combination thereof.

Figure 11:
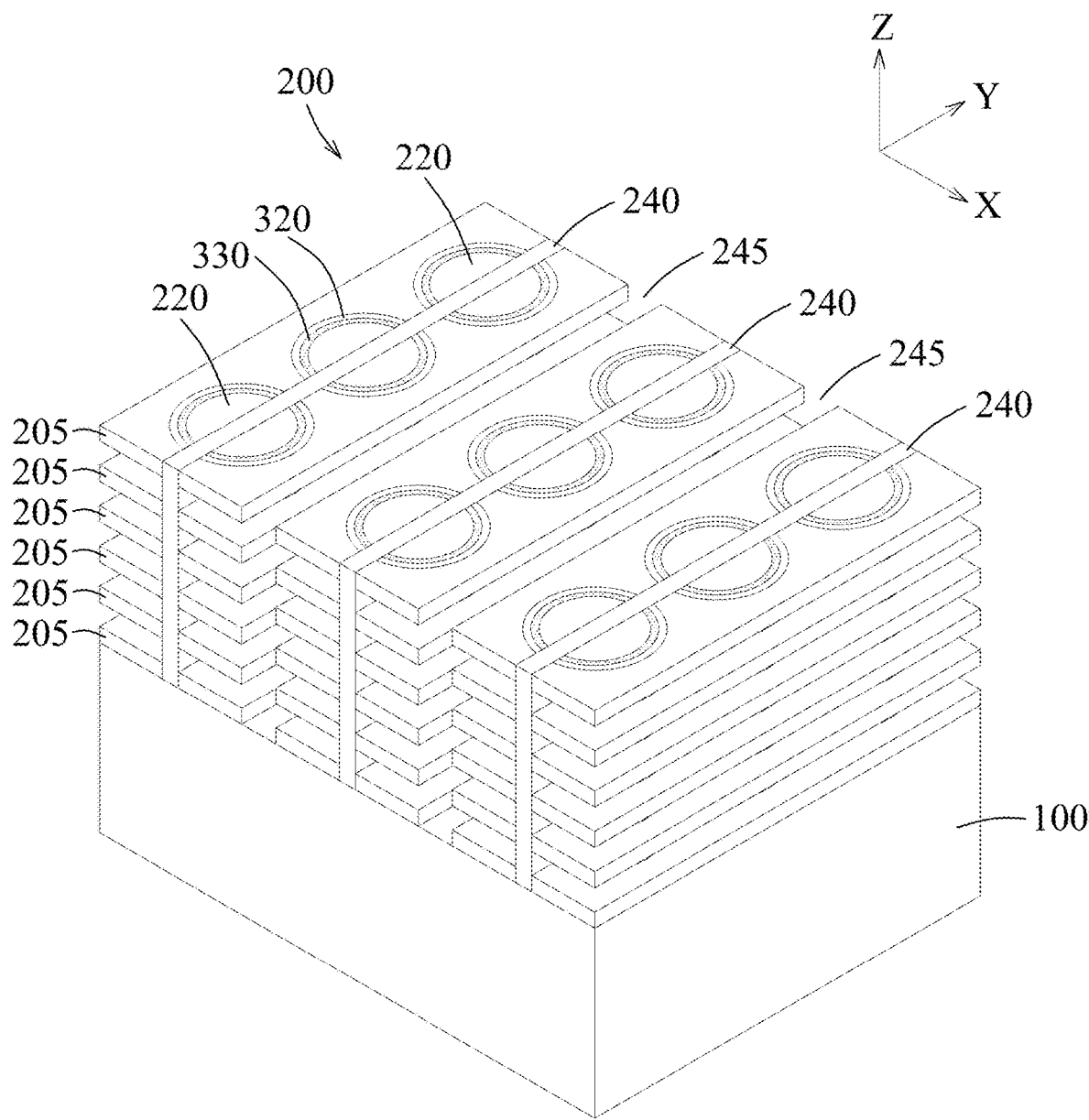

Referring to FIG. 11, the sacrificial layers 210 of the multilayer stack 200 are removed using isotropic etching through the replacement trenches 245. In some embodiments, the sacrificial layers 210 may be etched using, for example, wet etching, atomic layer etching (ALE), other suitable techniques, or any combination thereof.

Figure 12:
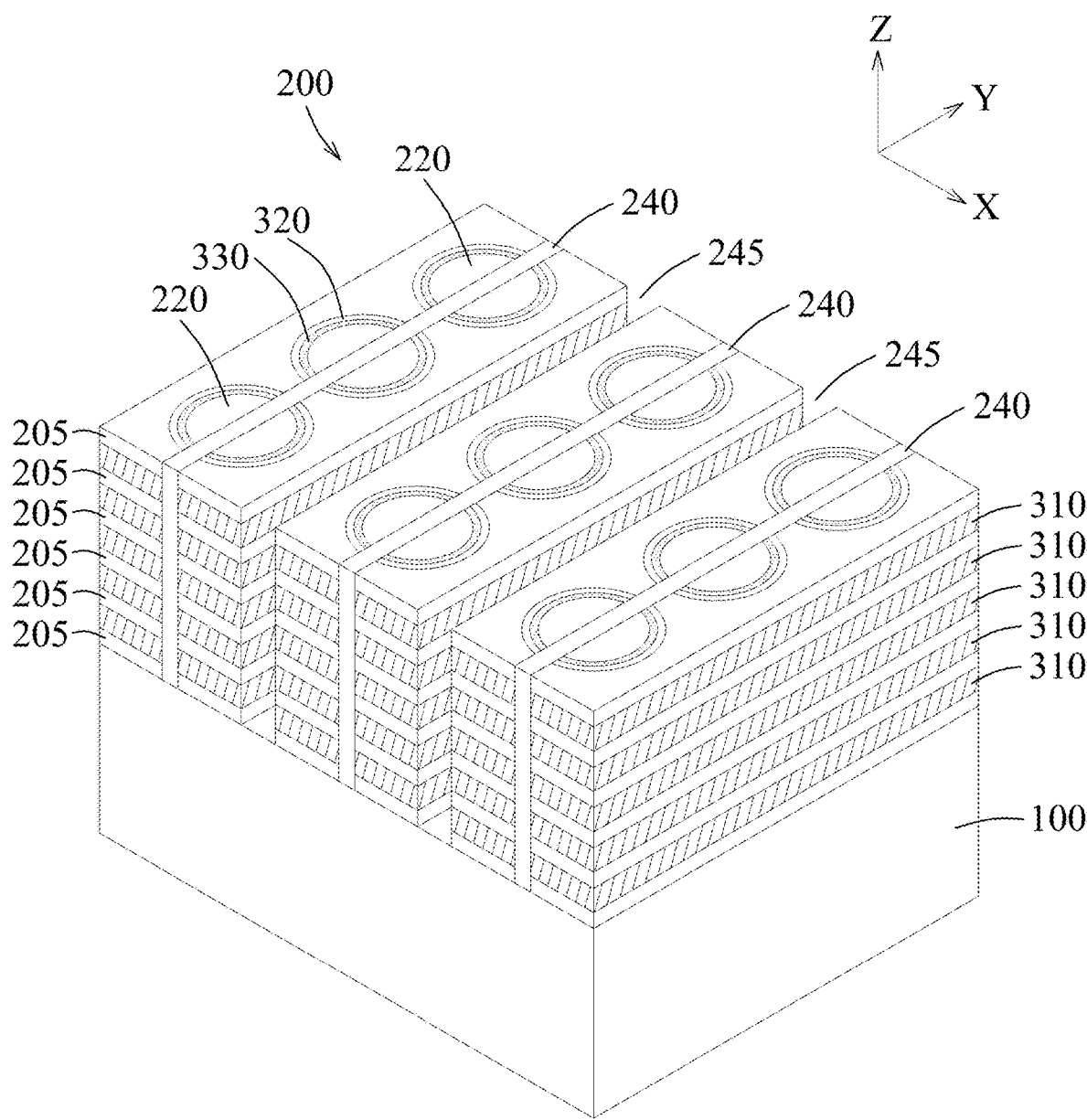

Referring to FIG. 12, multiple word-line layers 310 are formed between the isolation layers 205, so as to form the word-line electrodes 310A, 310B (see FIG. 1) for different layers of the memory devices 300. In some embodiments, the replacement trenches 245 have a width greater than the thickness of the sacrificial layers 210, so as to ensure that the word-line material can be fully deposited between the isolation layers 205 before the replacement trenches 245 are blocked by the word-line material. Then, an etching back process is performed to remove the word-line material deposited in the replacement trenches 245, so as to avoid undesired connection between different word-line electrodes 310A, 310B. The word-line layers 310 may be formed using, for example, ALD, CVD, other suitable techniques, or any combination thereof. The etching back process may be performed using isotropic etching, such as wet etching, ALE, other suitable techniques, or any combination thereof.

After the process steps as illustrated in FIGS. 10, 11 and 12 are performed, the sacrificial layers 210 of the multilayer stack 200 are replaced respectively with the word-line layers 310.

Figure 13:
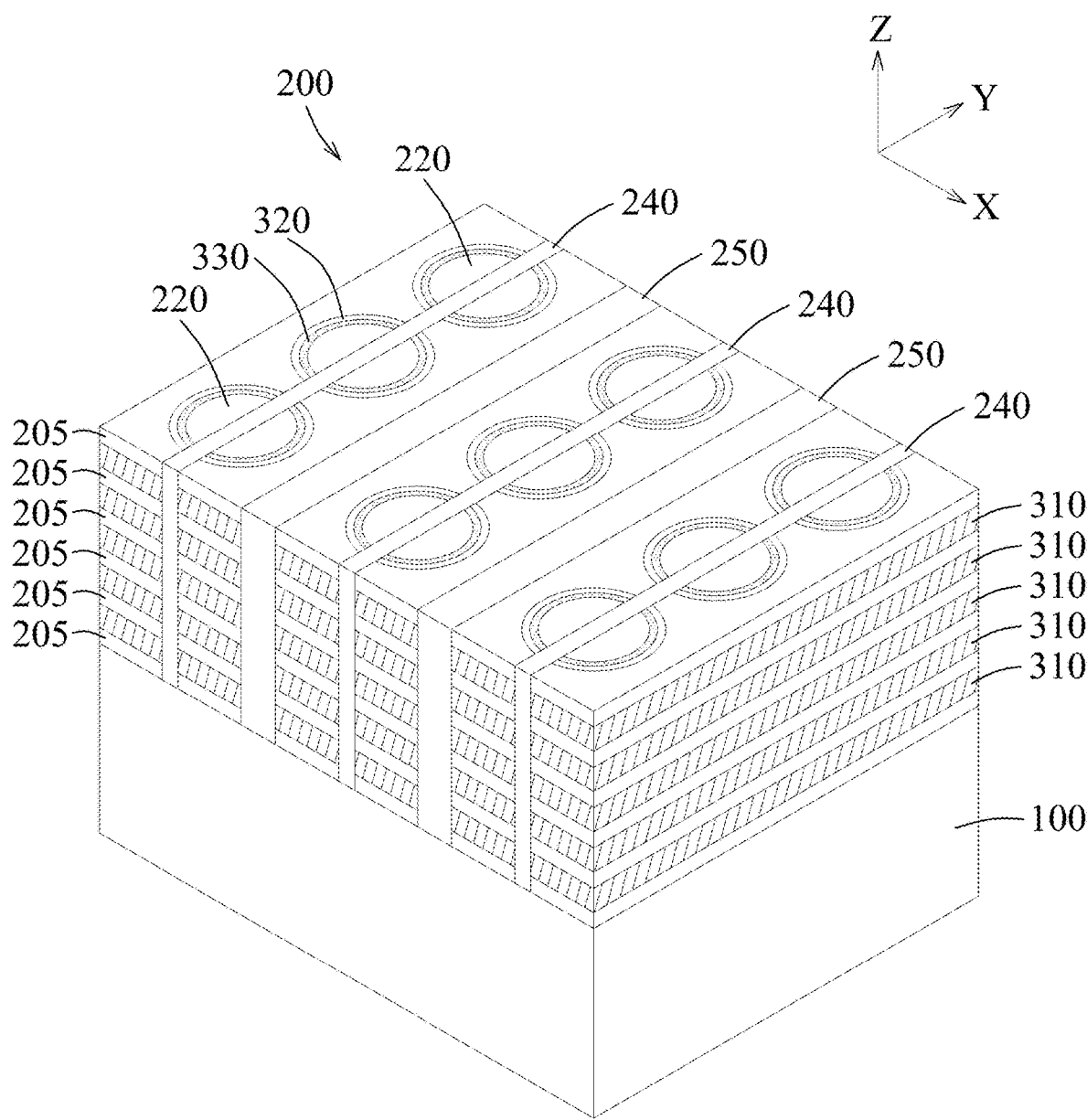

Referring to FIG. 13, with respect to each of the replacement trenches 245 (see FIG. 12), a trench-filling isolation layer 250 is deposited to fill the replacement trench 245. In some embodiments, the trench-filling isolation layer 250 may be formed using, for example, CVD, ALD, other suitable techniques, or a combination thereof, and includes the same or similar material as used in the stack-spacing isolation layers 240. In the illustrative embodiment, the trench-filling isolation layer 250 is made of $SiO_2$. In some embodiments, a CMP process may be performed after the deposition of the trench-filling isolation layer 250.

Figure 14:
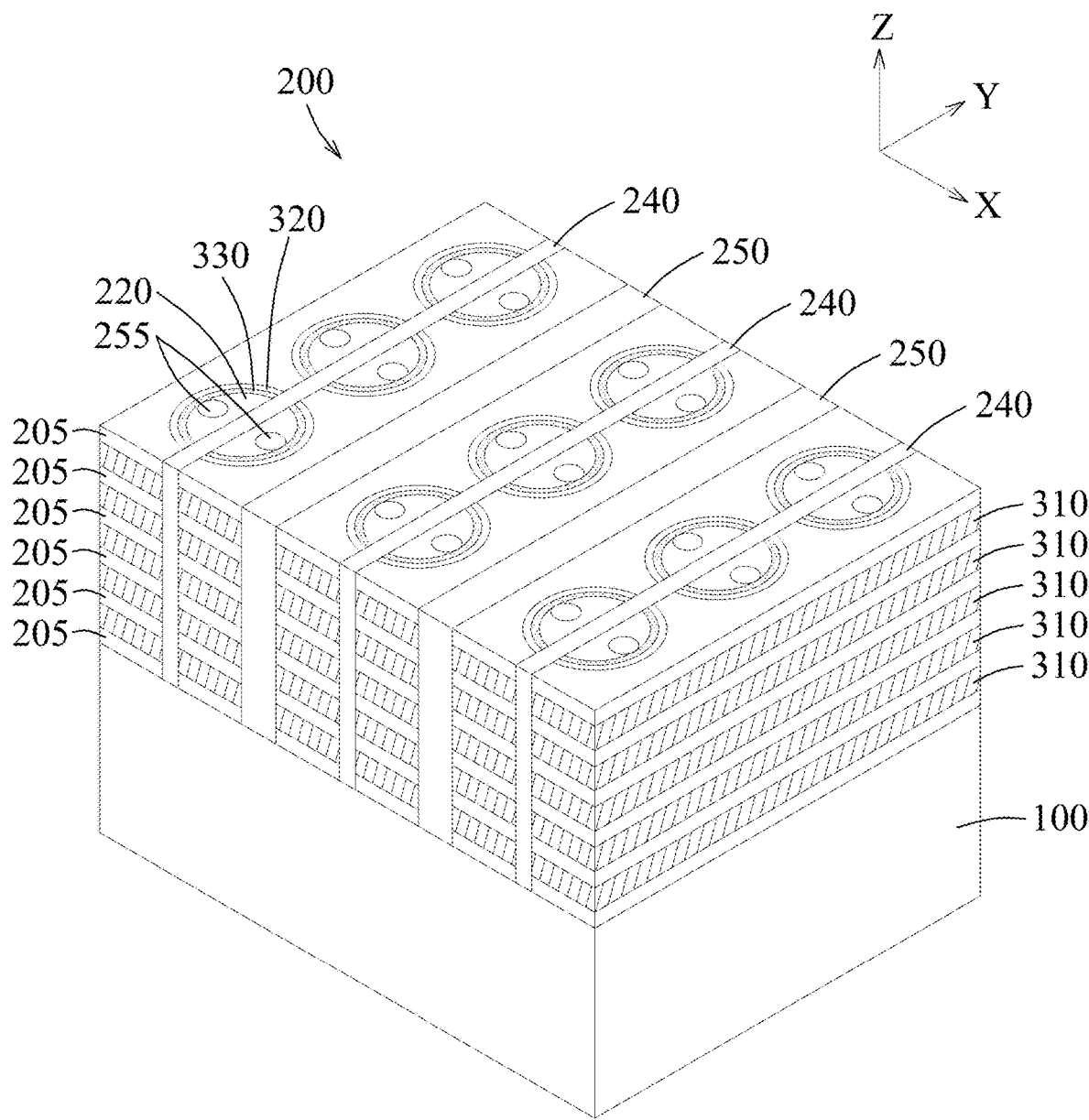

Referring to FIG. 14, with respect to each of the pillar features, the isolation pillar component 220 is etched using anisotropic etching to form two preliminary source-line electrode holes 255 respectively in the two separate portions of the pillar feature, where the preliminary source-line electrode holes 255 extend through the isolation pillar component 220 in the Z-axis direction. The preliminary source-line electrode holes 255 may be formed using, for example, dry etching, RIE, other suitable techniques, or any combination thereof.

Figure 15:
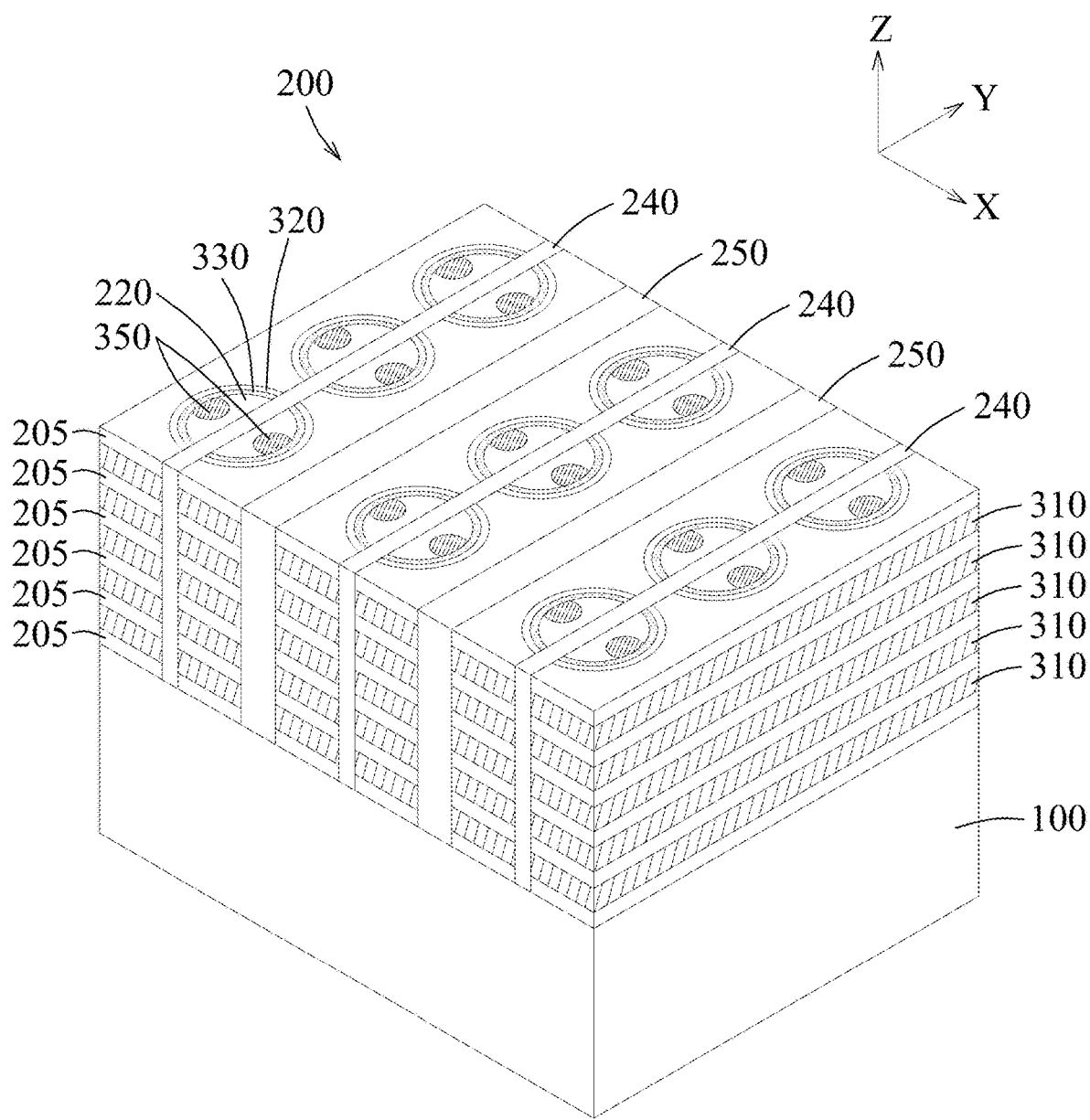

Referring to FIG. 15, a pushback process is performed using isotropic etching to enlarge the preliminary source-line electrode holes 255 (see FIG. 14), and source-line material layers 350 are deposited to fill the enlarged preliminary source-line electrode holes (referred to as final source-line electrode holes hereinafter), so as to form the source-line electrodes 350A, 350B of the memory devices 300 (see FIG. 1). The pushback process is to make the source-line electrodes 350A, 350B have a larger contact area respectively with the channel features 330A, 330B (see FIG. 1), and may be performed using, for example, ALE, other suitable techniques, or any combination thereof. The source-line material layers 350 may be deposited using, for example, CVD, ALD, other suitable techniques, or any combination thereof. In the illustrative embodiment, the preliminary source-line electrode holes 255 are holes with circular cross-sections, so a contour of the first source-line electrode 350A has an arc portion that is concave toward the first channel feature 330A, and a contour of the second source-line electrode 350B has an arc portion that is concave toward the second channel feature 330B. In some embodiments, a length of the source electrode 350A, 350B in either the X-axis direction or the Y-axis direction may be in a range from about 20 nm to about 200 nm. An excessively thin source-line electrode 350A, 350B (e.g., the length being smaller than 20 nm) may induce an excessively large electrical resistance, and an excessively thick source-line electrode 350A, 350B (e.g., the length being greater than 200 nm) may result in poor isolation among the source-line electrodes 350A, 350B and the data storage features 380A, 380B.

In some other embodiments, the preliminary source-line electrode holes 255 may be formed to have other shapes, such as having rectangular cross-sections (including square cross-sections). When the preliminary source-line electrode holes have rectangular cross-sections, a top view of the source-line electrodes 350A, 350B formed in the enlarged preliminary source-line electrode holes (i.e., the final source-line electrode holes) may be rectangular (square included) in shape. For example, the top view of each source-line electrode 350A, 350B in FIG. 19 is square in shape.

After the process steps as illustrated in FIGS. 14 and 15 are performed, the source-line electrodes 350A, 350B (see FIG. 1) are formed respectively in the two separate portions of each pillar feature, and each of the source-line electrodes 350A, 350B is in contact with the channel layer 330 in the respective one of the two separate portions of the pillar feature, and extends through the isolation pillar component 220 in the Z-axis direction.

Figure 16:
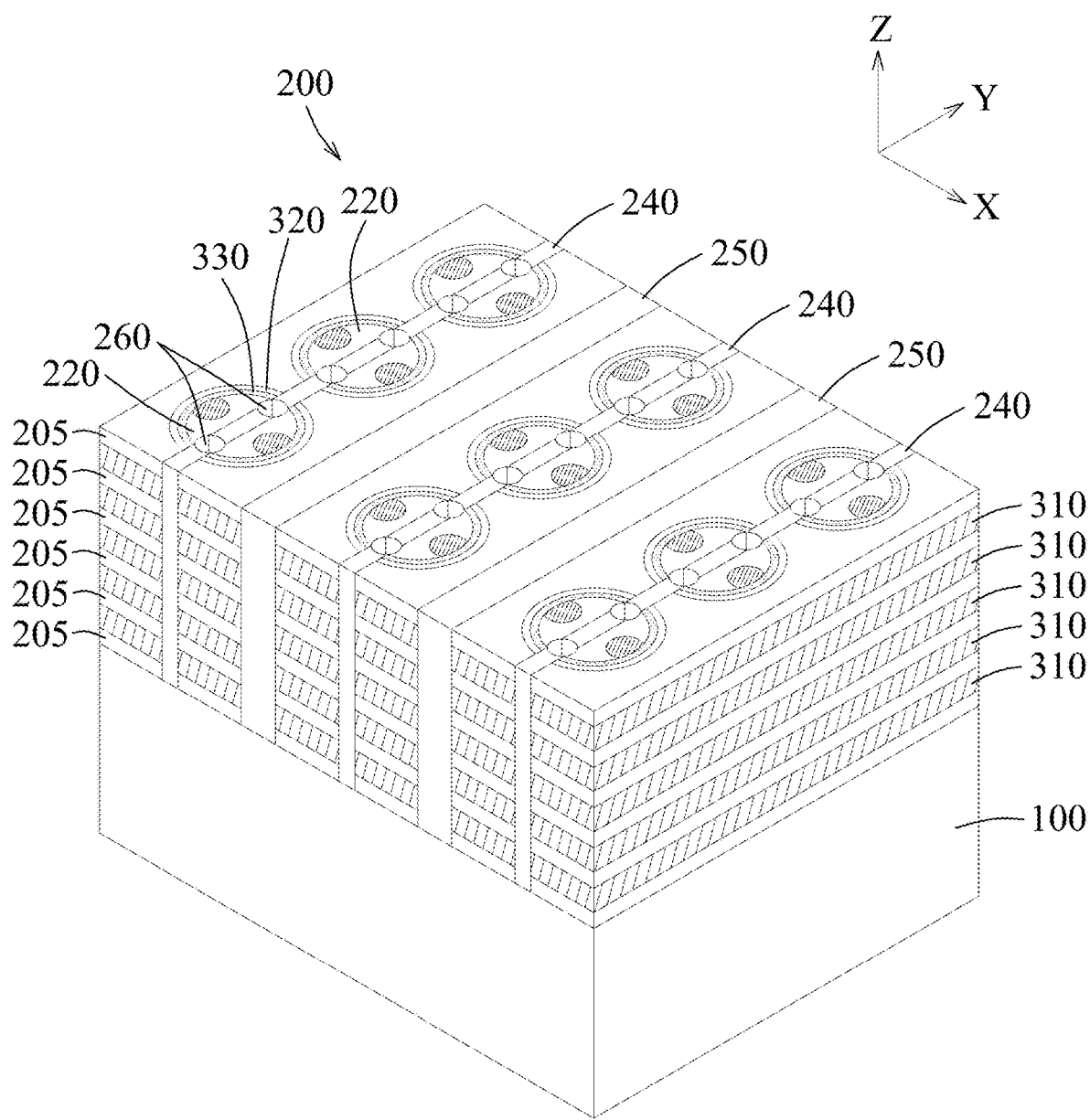

Referring to FIG. 16, with respect to each of the pillar features, the isolation pillar component 220 is etched using anisotropic etching to form, between the two separate portions of the pillar feature, two preliminary bit-line electrode holes 260 respectively at end portions of the pillar feature opposite to each other in the Y-axis direction. The preliminary bit-line electrode holes 260 extend in the Z-axis direction, and may be formed using, for example, dry etching, RIE, other suitable techniques, or any combination thereof. Essentially, the preliminary bit-line electrode holes 260 extend through a part of the isolation pillar component 240 that serves as part of the isolation pillar component 220.

Figure 17:
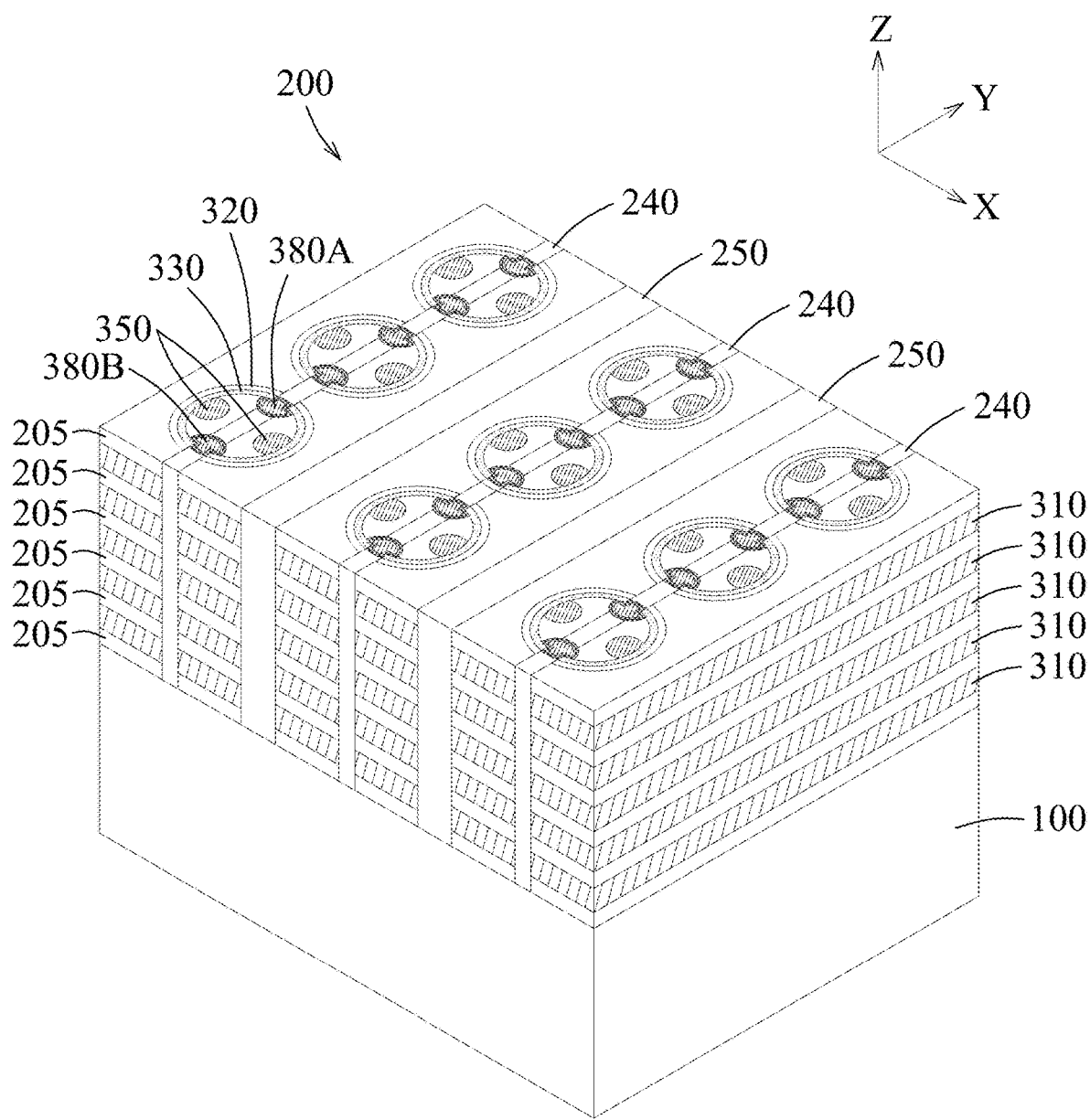

Referring to FIG. 17, a pushback process is performed using isotropic etching to enlarge the preliminary bit-line electrode holes 260 (see FIG. 16), so as to form enlarged preliminary bit-line electrode holes (referred to as final bit-line electrode holes hereinafter) each extending in between the separate portions of the corresponding pillar feature, and the channel layer 330 in both of the two separate portions of the pillar feature (i.e., the channel features 330A, 330B in FIG. 1) is exposed from the final bit-line electrode holes. Subsequently, a metal electrode layer is conformally deposited on a sidewall of each of the final bit-line electrode holes to form the first metal electrode layer 360A and the second metal electrode layer 360B (see FIG. 1); a data storage layer is conformally deposited on the first metal electrode layer 360A and the second metal electrode layer 360B to form the first data storage layer 370A and the second data storage layer 370B (see FIG. 1), respectively; and then a metal layer is deposited to fill the final bit-line electrode holes to form the bit-line electrodes 340A, 340B (see FIG. 1), so as to form the data storage features 380A, 380B. In some embodiments, a CMP process is performed after the bit-line electrodes 340A, 340B are formed. The pushback process is to make the data storage features 380A, 380B have a larger contact area respectively with the channel features 330A, 330B, and may be performed using, for example, ALE, other suitable techniques, or any combination thereof. The metal electrode layers 360A, 360B, the data storage layers 370A, 370B and the bit-line electrodes 340A, 340B may be deposited using, for example, ALD, other suitable techniques, or any combination thereof. In some embodiments, each of the first metal electrode layer 360A and the second metal electrode layer 360B may have a thickness in a range from about 2.5 nm to about 50 nm, and each of the first data storage layer 370A and the second data storage layer 370B may have a thickness in a range from about 2.5 nm to about 50 nm. If the thicknesses of the first metal electrode layer 360A, the second metal electrode layer 360B, the first data storage layer 370A or the second data storage layer 370B is excessively small (e.g., smaller than 2.5 nm), the difficulty of manufacturing may be significantly increased. In addition, the excessively thin first and second data storage layers 370A, 370B may not have sufficient dipoles to induce required polarization. If the thicknesses of the first metal electrode layer 360A, the second metal electrode layer 360B, the first data storage layer 370A or the second data storage layer 370B is excessively large (e.g., greater than 50 nm), the bit-line electrodes 340A, 340B may be too thin to have appropriate electrical resistances.

After the process steps as illustrated in FIGS. 16 and 17 are performed, the data storage features 380A, 380B (see FIG. 1) are formed between the two separate portions of the pillar feature and are located respectively at the opposite end portions of the pillar feature, and extend through the isolation pillar component 220 in the Z-axis direction. The metal electrode layer 360A, 360B of each of the data storage features 380A, 380B is in contact with the channel layer 330 in both of the two separate portions of the pillar feature.

Because of the pushback process that enlarges the preliminary bit-line electrode holes 260 (see FIG. 16), each of the data storage features 380A, 380B that is formed in the bit-line electrode hole has a head portion and a shank portion, as illustrated in FIG. 1. The head portion of the first data storage feature 380A is in contact with a surface of the first end portion of the first channel feature 330A opposite to the first gate dielectric 320A and in contact with a surface of the first end portion of the second channel feature 330B opposite to the second gate dielectric 320B, and the shank portion of the first data storage feature 380A is disposed between the first end portions of the first channel feature 330A and the second channel feature 330B. The head portion of the second data storage feature 380B is in contact with a surface of the second end portion of the first channel feature 330A opposite to the first gate dielectric 320A and in contact with a surface of the second end portion of the second channel feature 330B opposite to the second gate dielectric 320B, and the shank portion of the second data storage feature 380B is disposed between the second end portions of the first channel feature 330A and the second channel feature 330B. In comparison to the preliminary bit-line electrode holes 260, the data storage features 380A, 380B formed in the final bit-line electrode holes of such configuration have a larger contact area with the channel features 330A, 330B, and thus are advantageous for data storage operation.

In the illustrative embodiment, the preliminary bit-line electrode holes 260 have circular cross-sections, so a contour of the head portion of the first data storage feature 380A has an arc portion that is concave toward the shank portion of the first data storage feature 380A, and a contour of the head portion of the second data storage feature 380B has an arc portion that is concave toward the shank portion of the second data storage feature 380B. In some embodiments, a length of the data storage portion 380A, 380B in either the X-axis direction or the Y-axis direction may be in a range from about 20 nm to about 200 nm. An excessively thin data storage portion 380A, 380B (e.g., the length being smaller than 20 nm) may have an excessively thin bit-line electrode 340A, 340B, inducing excessively large electrical resistance of the bit-line electrode 340A, 340B, and an excessively thick data storage portion 380A, 380B (e.g., the length being greater than 200 nm) may result in poor isolation among the source-line electrodes 350A, 350B and the data storage features 380A, 380B.

In some other embodiments, the preliminary bit-line electrode holes 260 may be formed to have other shapes, such as having rectangular cross-sections (including square cross-sections). The final bit-line electrode holes that result from preliminary source-line electrode holes with rectangular cross-sections may include square head portions. When the preliminary bit-line electrode holes have rectangular cross-sections, a top view of the head portions of the resultant data storage features 380A, 380B formed in the enlarged preliminary bit-line electrode holes (i.e., the final bit-line electrode holes) may be rectangular (square included) in shape. For example, the top view of each data storage feature 380A, 380B in FIG. 19 is a square in shape, where a contour of the head portion of the first data storage feature 380A has a U-shaped portion that has three straight segments, and that is concave toward the shank portion of the first data storage feature 380A, and a contour of the head portion of the second data storage feature 380B has a U-shaped portion that has three straight segments and that is concave toward the shank portion of the second data storage feature 380B.

It is noted that the channel holes 215, the preliminary source-line electrode holes 255 and the preliminary bit-line electrode holes 260 may be formed to have either the same shape or different shapes, and this disclosure is not limited in this respect. As exemplified in FIG. 18, the memory device 300 is fabricated using a channel hole with a square cross-section, and preliminary source-line electrode holes and preliminary bit-line electrode holes with circular cross-sections are formed.

It is noted that the bit-line electrodes 340A, 340B, the source-line electrodes 350A, 350B and the metal electrode layers 360A, 360B may be made of either the same or different materials based on specific design considerations. For example, one design consideration may be that the bit-line electrodes 340A, 340B and the source-line electrodes 350A, 350B are to have low electrical resistance, and the metal electrode layers 360A, 360B are to have good contact with the channel features 330A, 330B and the data storage layers 370A, 370B, but this disclosure is not limited in this respect.

In summary, the memory device 300 of each illustrative embodiment includes four memory cells that are formed within a limited area, with two source-line electrodes each to be shared between two of the memory cells and two data storage features each to be shared between two of the memory cells, and is a high-density memory structure suitable for large-capacity data storage.

In accordance with some embodiments, a memory device is provided to include a first word-line electrode, a first gate dielectric, a first channel feature, a first source-line electrode, a second word-line electrode, a second gate dielectric, a second channel feature, a second source-line electrode, a first data storage feature and a second data storage feature. The first gate dielectric is disposed on the first word-line electrode. The first channel feature is disposed on the first gate dielectric, and has a first end portion and a second end portion that are opposite to each other. The first source-line electrode is disposed on the first channel feature. The second word-line electrode is spaced apart from the first word-line electrode. The second gate dielectric is disposed on the second word-line electrode. The second channel feature is disposed on the second gate dielectric, and has a first end portion and a second end portion that are opposite to each other. The second source-line electrode is disposed on the second channel feature. The first data storage feature has a first metal electrode layer, a first bit-line electrode, and a first data storage layer disposed between the first metal electrode layer and the first bit-line electrode. The second data storage feature has a second metal electrode layer, a second bit-line electrode, and a second data storage layer disposed between the second metal electrode layer and the second bit-line electrode. The first metal electrode layer of the first data storage feature has a first portion and a second portion that are respectively in contact with the first end portions of the first channel feature and the second channel feature. The first data storage layer has a first portion and a second portion that are respectively in contact with the first and second portions of the first metal electrode layer. The first bit-line electrode is in contact with the first and second portions of the first data storage layer. The second metal electrode layer of the second data storage feature has a first portion and a second portion that are respectively in contact with the second end portions of the first channel feature and the second channel feature, the second data storage layer has a first portion and a second portion that are respectively in contact with the first and second portions of the second metal electrode layer, and the second bit-line electrode is in contact with the first and second portions of the second data storage layer.

In accordance with some embodiments, each of the first gate dielectric and the first channel feature is concave toward the second gate dielectric and the second channel feature, and each of the second gate dielectric and the second channel feature is concave toward the first gate dielectric and the first channel feature. The first channel feature is disposed on a surface of the first gate dielectric that faces toward the second gate dielectric and the second channel feature, and the second channel feature is disposed on a surface of the second gate dielectric that faces toward the first gate dielectric and the first channel feature.

In accordance with some embodiments, the first end portions of the first channel feature and the second channel feature are aligned with each other in an X-axis direction, and the second end portions of the first channel feature and the second channel feature are aligned with each other in the X-axis direction.

In accordance with some embodiments, the first data storage feature and the second data storage feature are located on a first imaginary line at symmetric position with respect to a second imaginary line, the first imaginary line extending in a Y-axis direction perpendicular in the X-axis direction, the second imaginary line extending in the X-axis direction. The first source-line electrode and the second source-line electrode are located on the second imaginary line at symmetric positions with respect to the first imaginary line.

In accordance with some embodiments, the first data storage layer surrounds the first bit-line electrode, and the first metal electrode layer surrounds the first data storage layer. The second data storage layer surrounds the second bit-line electrode, and the second metal electrode layer surrounds the second data storage layer. The first data storage feature has a head portion that is in contact with a surface of the first end portion of the first channel feature opposite to the first gate dielectric and in contact with a surface of the first end portion of the second channel feature opposite to the second gate dielectric, and a shank portion that is disposed between the first end portions of the first channel feature and the second channel feature. The second data storage feature has a head portion that is in contact with a surface of the second end portion of the first channel feature opposite to the first gate dielectric and in contact with a surface of the second end portion of the second channel feature opposite to the second gate dielectric, and a shank portion that is disposed between the second end portions of the first channel feature and the second channel feature.

In accordance with some embodiments, each of the first gate dielectric, the first channel feature, the second gate dielectric and the second channel feature is an arc in shape.

In accordance with some embodiments, a contour of the head portion of the first data storage feature has an arc portion that is concave toward the shank portion of the first data storage feature, and a contour of the head portion of the second data storage feature has an arc portion that is concave toward the shank portion of the second data storage feature. A contour of the first source-line electrode has an arc portion that is concave toward the first channel feature, and a contour of the second source-line electrode has an arc portion that is concave toward the second channel feature.

In accordance with some embodiments, each of the first gate dielectric, the first channel feature, the second gate dielectric and the second channel feature is U-shaped.

In accordance with some embodiments, a contour of the head portion of the first data storage feature has an arc portion that is concave toward the shank portion of the first data storage feature, and a contour of the head portion of the second data storage feature has an arc portion that is concave toward the shank portion of the second data storage feature. A contour of the first source-line electrode has an arc portion that is concave toward the first channel feature, and a contour of the second source-line electrode has an arc portion that is concave toward the second channel feature.

In accordance with some embodiments, a contour of the head portion of the first data storage feature has a U-shaped portion that is concave toward the shank portion of the first data storage feature, and a contour of the head portion of the second data storage feature has a U-shaped portion that is concave toward the shank portion of the second data storage feature. The first source-line electrode is rectangular in shape, and the second source-line electrode is rectangular in shape.

In accordance with some embodiments, a method for forming a three-dimensional memory structure is provided. In one step, a multilayer stack is formed on a substrate. The multilayer stack includes multiple sacrificial layers and multiple isolation layers that are alternately stacked together in a Z-axis direction. In one step, a pillar feature is formed in the multilayer stack. The pillar feature includes an isolation pillar component that extends through the multilayer stack in the Z-axis direction, a channel layer that is disposed on and that surrounds the isolation pillar component, and a gate dielectric layer that surrounds the channel layer and that is disposed between the channel layer and the multilayer stack. In one step, forming a stack-spacing isolation feature is formed to extend in a Y-axis direction perpendicular to the Z-axis direction, and to divide the pillar feature and a part of the multilayer stack surrounding the pillar feature into two separate portions. In one step, the multilayer stack is etched to form a replacement trench adjacent to the pillar feature, where the replacement trench extends in the Y-axis direction. In one step, the sacrificial layers of the multilayer stack are replaced respectively with multiple word-line layers through the replacement trench. In one step, two source-line electrodes are formed respectively in the two separate portions of the pillar feature. Each of the source-line electrodes is in contact with the channel layer in the respective one of the two separate portions of the pillar feature, and extends through the isolation pillar component in the Z-axis direction. In one step, between the two separate portions of the pillar feature, two data storage features are formed respectively at opposite end portions of the pillar feature. Each of the data storage features is in contact with the channel layer in both of the two separate portions of the pillar feature, and extends through the isolation pillar component in the Z-axis direction.

In accordance with some embodiments, each of the data storage features includes a bit-line electrode that extends through the isolation pillar component in the Z-axis direction, a data storage layer that surrounds the bit-line electrode, and a metal electrode layer that surrounds the data storage layer and that is in contact with the channel layer in both of the two separate portions of the pillar feature.

In accordance with some embodiments, the step of forming the two data storage features includes the following sub-steps. In one sub-step, the isolation pillar component is etched to form, between the two separate portions of the pillar feature, two bit-line electrode holes respectively at the opposite end portions of the pillar feature. The bit-line electrode holes extend through the isolation pillar component in the Z-axis direction, and the channel layer in both of the two separate portions of the pillar feature is exposed from the bit-line electrode holes. In one sub-step, the metal electrode layer is deposited on a sidewall of each of the bit-line electrode holes. In one sub-step, the data storage layer is deposited on the metal electrode layer. In one sub-step, a metal layer is deposited to fill the bit-line electrode holes to form the bit-line electrodes of the data storage features after depositing the metal electrode layer and the data storage layer.

In accordance with some embodiments, the two bit-line electrode holes are formed by the following steps. In one step, the isolation pillar component is etched to form, between the two separate portions of the pillar feature, two preliminary bit-line electrode holes at the opposite end portions of the pillar feature. Each of the preliminary bit-line electrode holes has a circular cross-section or a rectangular cross-section and extends through the isolation pillar component in the Z-axis direction. In one step, a pullback process is performed to enlarge the preliminary bit-line electrode holes to form the bit-line electrode holes.

In accordance with some embodiments, the step of forming the pillar feature includes the following sub-steps. In one sub-step, the multilayer stack is etched to form a channel hole that extends through the multilayer stack in the Z-axis direction. In one sub-step, the gate dielectric layer is deposited on a sidewall of the channel hole. In one sub-step, the channel layer is deposited on the gate dielectric layer. In one sub-step, a channel-hole isolation layer is deposited to fill the channel hole to form the isolation pillar component after depositing the gate dielectric layer and the channel layer.

In accordance with some embodiments, the channel hole has a circular cross-section or a rectangular cross-section.

In accordance with some embodiments, the step of forming the stack-spacing isolation feature includes the following sub-steps. In one sub-step, a spacing trench is formed to extend in the Y-axis direction and to divide the pillar feature and the part of the multilayer stack into the two separate portions. In one sub-step, a word-line isolation layer is deposited to fill the spacing trench, so as to form the stack-spacing isolation feature.

In accordance with some embodiments, a memory device is provided to include a first memory cell, a second memory cell, a third memory cell and a fourth memory cell. The first memory cell and the second memory cell have a common first word-line electrode and a common first source-line electrode. The third memory cell and the fourth memory cell have a common second word-line electrode and a common second source-line electrode. The first memory cell and the third memory cell have a common first data storage feature, and the second memory cell and the fourth memory cell have a common second data storage feature. The first memory cell includes a first transistor that has a control terminal formed by the common first word-line electrode, a first terminal connected to the first data storage feature, and a second terminal formed by the common first source-line electrode. The second memory cell includes a second transistor that has a control terminal formed by the common first word-line electrode, a first terminal connected to the second data storage feature, and a second terminal formed by the common first source-line electrode. The third memory cell includes a third transistor that has a control terminal formed by the common second word-line electrode, a first terminal connected to the first data storage feature, and a second terminal formed by the common second source-line electrode. The fourth memory cell includes a fourth transistor that has a control terminal formed by the common second word-line electrode, a first terminal connected to the second data storage feature, and a second terminal formed by the common second source-line electrode.

In accordance with some embodiments, the common first data storage feature and the common second data storage feature are located on a first imaginary line at symmetric positions with respect to a second imaginary line, the first imaginary line extending in a Y-axis direction, and the second imaginary line extending in an X-axis direction that is perpendicular to the Y-axis direction. The common first source-line electrode and the common second source-line electrode are located on the second imaginary line at symmetric positions with respect to the first imaginary line.

In accordance with some embodiments, the common first data storage feature includes a first bit-line electrode, a first data storage layer surrounding the first bit-line electrode, and a first metal electrode layer surrounding the first data storage layer and connected to the first terminals of the first transistor and the third transistor. The common second data storage feature includes a second bit-line electrode, a second data storage layer surrounding the second bit-line electrode, and a second metal electrode layer surrounding the second data storage layer and connected to the first terminals of the second transistor and the fourth transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a three-dimensional memory structure, comprising steps of:
    forming a multilayer stack on a substrate, the multilayer stack including multiple sacrificial layers and multiple isolation layers that are alternately stacked together in a Z-axis direction;
    forming a pillar feature in the multilayer stack, the pillar feature including an isolation pillar component that extends through the multilayer stack in the Z-axis direction, a channel layer that is disposed on and that surrounds the isolation pillar component, and a gate dielectric layer that surrounds the channel layer and that is disposed between the channel layer and the multilayer stack;
    forming a stack-spacing isolation feature that extends in a Y-axis direction perpendicular to the Z-axis direction, and that divides the pillar feature and a part of the multilayer stack surrounding the pillar feature into two separate portions;
    etching the multilayer stack to form a replacement trench adjacent to the pillar feature, the replacement trench extending in the Y-axis direction;
    replacing the sacrificial layers of the multilayer stack respectively with multiple word-line layers through the replacement trench;
    forming two source-line electrodes respectively in the two separate portions of the pillar feature, each of the source-line electrodes being in contact with the channel layer in the respective one of the two separate portions of the pillar feature, and extending through the isolation pillar component in the Z-axis direction; and
    between the two separate portions of the pillar feature, forming two data storage features respectively at opposite end portions of the pillar feature, each of the data storage features being in contact with the channel layer in both of the two separate portions of the pillar feature, and extending through the isolation pillar component in the Z-axis direction.

2. The method according to claim 1, wherein each of the data storage features includes a bit-line electrode that extends through the isolation pillar component in the Z-axis direction, a data storage layer that surrounds the bit-line electrode, and a metal electrode layer that surrounds the data storage layer and that is in contact with the channel layer in both of the two separate portions of the pillar feature.

3. The method according to claim 2, wherein the step of forming the two data storage features includes:
    etching the isolation pillar component to form, between the two separate portions of the pillar feature, two bit-line electrode holes respectively at the opposite end portions of the pillar feature, wherein the bit-line electrode holes extend through the isolation pillar component in the Z-axis direction, and the channel layer in both of the two separate portions of the pillar feature is exposed from the bit-line electrode holes;
    depositing the metal electrode layer on a sidewall of each of the bit-line electrode holes;
    depositing the data storage layer on the metal electrode layer;
    depositing a metal layer to fill the bit-line electrode holes to form the bit-line electrodes of the data storage features after depositing the metal electrode layer and the data storage layer.

4. The method according to claim 3, wherein the two bit-line electrode holes are formed by:
    etching the isolation pillar component to form, between the two separate portions of the pillar feature, two preliminary bit-line electrode holes at the opposite end portions of the pillar feature, each of the preliminary bit-line electrode holes having a circular cross-section or a rectangular cross-section and extending through the isolation pillar component in the Z-axis direction; and
    performing a pullback process to enlarge the preliminary bit-line electrode holes to form the bit-line electrode holes.

5. The method according to claim 1, wherein the step of forming the pillar feature includes:
    etching the multilayer stack to form a channel hole that extends through the multilayer stack in the Z-axis direction;
    depositing the gate dielectric layer on a sidewall of the channel hole;
    depositing the channel layer on the gate dielectric layer; and
    depositing a channel-hole isolation layer to fill the channel hole to form the isolation pillar component after depositing the gate dielectric layer and the channel layer.

6. The method according to claim 5, wherein the channel hole has a circular cross-section or a rectangular cross-section.

7. The method according to claim 1, wherein the step of forming the stack-spacing isolation feature includes:
  forming a spacing trench that extends in the Y-axis direction and that divides the pillar feature and the part of the multilayer stack into the two separate portions; and
  depositing a word-line isolation layer to fill the spacing trench, so as to form the stack-spacing isolation feature.

* * * * *